(12) United States Patent
Ren et al.

(10) Patent No.: US 12,302,759 B2
(45) Date of Patent: May 13, 2025

(54) METHOD FOR OBTAINING LEAD-FREE PIEZOELECTRIC MATERIALS AND CORRESPONDING LEAD-FREE PIEZOELECTRIC MATERIALS

(71) Applicants: Xi'an Jiaotong University, Shaanxi (CN); National Institute for Materials Science, Tsukuba (JP)

(72) Inventors: Xiaobing Ren, Shaanxi (CN); Shuai Ren, Shaanxi (CN); Yanshuang Hao, Shaanxi (CN); Minxia Fang, Shaanxi (CN)

(73) Assignees: Xi'an Jiaotong University, Xi'an (CN); National Institute for Materials Science, Tsukuba (JP)

( * ) Notice: Subject to any disclaimer, the term of this patent is extended or adjusted under 35 U.S.C. 154(b) by 1199 days.

(21) Appl. No.: 17/076,521

(22) Filed: Oct. 21, 2020

(65) Prior Publication Data
US 2022/0037584 A1 Feb. 3, 2022

Related U.S. Application Data

(63) Continuation of application No. PCT/CN2019/083695, filed on Apr. 22, 2019.

(30) Foreign Application Priority Data

Apr. 23, 2018 (CN) .......................... 201810364324.1

(51) Int. Cl.
| | |
|---|---|
| H10N 30/85 | (2023.01) |
| C04B 35/495 | (2006.01) |
| C04B 35/64 | (2006.01) |
| H01L 21/02 | (2006.01) |
| H10N 30/097 | (2023.01) |
| H10N 30/20 | (2023.01) |
| H10N 30/30 | (2023.01) |
| H10N 30/853 | (2023.01) |

(52) U.S. Cl.
CPC ....... *H10N 30/8542* (2023.02); *C04B 35/495* (2013.01); *C04B 35/64* (2013.01); *H10N 30/097* (2023.02); *H10N 30/20* (2023.02); *H10N 30/302* (2023.02); *C04B 2235/3248* (2013.01); *C04B 2235/3255* (2013.01)

(58) Field of Classification Search
CPC ........... H10N 30/8542; H10N 30/8536; H10N 30/85; H10N 30/853; H10N 30/8561; C04B 35/495; C04B 35/49; C04B 35/4682; C04B 35/453; C04B 35/465; C04B 35/4686; C04B 35/48; C04B 2235/3248; C04B 2235/3251; C04B 2235/3255; C04B 2235/3201; C04B 2235/3203; C04B 2235/3206; C04B 2235/3208; C04B 2235/3213; C04B 2235/3215; C04B 2235/3244; C04B 2235/3293; C04B 2235/768; H01L 21/02197; H01L 21/031691

See application file for complete search history.

(56) References Cited

U.S. PATENT DOCUMENTS

| | | | |
|---|---|---|---|
| 2003/0178605 A1* | 9/2003 | Nonoyama | .......... H10N 30/853 252/500 |
| 2006/0192213 A1* | 8/2006 | Ohwada | ................. H01J 63/06 257/79 |
| 2007/0228318 A1 | 10/2007 | Yuuya | |

FOREIGN PATENT DOCUMENTS

| | | |
|---|---|---|
| CN | 103613379 A | 3/2014 |
| CN | 107098699 A | 8/2017 |
| JP | 2007204336 A | 8/2007 |

OTHER PUBLICATIONS

Jiang et al., "Dielectric and piezoelectric properties of LiSbO3 doped 0.995K0.5Na0.5NbO3—0.005BiFeO3 piezoelectric ceramics", Materials Letters 63, pp. 1262-1265. (Year: 2009).*
Li et al., "Enhanced ferroelectric properties in (Ba1—xCax)(Ti0.94Sn0.06)O3 lead-free ceramics", Journal of the European Ceramic Society 32, pp. 517-520. (Year: 2012).*
Coffeen, "Dielectric Bodies in the Quaternary System BaTiO3—BaSnO3—SrSnO3—CaSnO3", American Ceramic Society 54th meeting, pp. 215-221. (Year: 1952).*
Zhang et al., "Phase transition and piezoelectric properties of dense (K0.48Na0.52)0.95Li0.05SbxNb(1-x)O3—0.03Ca0.2(Bi0.5Na0.5)0.5ZrO3 lead free ceramics", Journal of Alloys and Compounds 664, pp. 503-509. (Year: 2016).*
International Search Report of PCT/CN2019/083695.
Written Opinion of PCT/CN2019/083695.
Yao, Yonggang et al. "Relationship Between Phase Coexistence and Properties in Piezoelectric Materials".

* cited by examiner

*Primary Examiner* — Matthew E. Hoban
*Assistant Examiner* — Lynne Edmondson

(57) ABSTRACT

The present disclosure relates to a method for obtaining lead-free piezoelectric materials, including: Step S100, adjusting the T/O phase boundary of a first lead-free piezoelectric material: for the first lead-free piezoelectric material, adjusting the T/O phase boundary between the tetragonal phase T and the orthorhombic phase O to be near the room temperature by doping; Step S200, further adjusting the C/T phase boundary and the O/R phase boundary: further adjusting the C/T phase boundary between the cubic paraelectric phase C and the tetragonal phase T, and the O/R phase boundary between the orthorhombic phase O and the rhombohedral phase R by doping, so as to enable the C/T phase boundary and the O/R phase boundary to approach the T/O phase boundary; and Step S300, obtaining second lead-free piezoelectric materials: obtaining multiple second lead-free piezoelectric materials with different piezoelectric constants $d_{33}$ and different Curie temperatures $T_C$ in the process.

14 Claims, 10 Drawing Sheets
(10 of 10 Drawing Sheet(s) Filed in Color)

METHOD FOR OBTAINING LEAD-FREE PIEZOELECTRIC MATERIALS AND CORRESPONDING LEAD-FREE PIEZOELECTRIC MATERIALS

CROSS-REFERENCE TO RELATED APPLICATIONS

This application is a bypass continuation of the international patent application PCT/CN2019/083695. This application also claims the benefit of the international patent application PCT/CN2019/083695, filed on Apr. 22, 2019 and Chinese prior application No. 201810364324.1, filed to the China National Intellectual Property Administration (CNIPA) on Apr. 21, 2018 and entitled "Method for Obtaining Lead-free Piezoelectric Materials and Corresponding Lead-free Piezoelectric Materials", of which the contents are incorporated in this application by reference in its entirety.

TECHNICAL FIELD

The present disclosure relates to the field of piezoelectric materials, in particular to a method for obtaining lead-free piezoelectric materials and corresponding lead-free piezoelectric materials.

BACKGROUND

Piezoelectric materials have become the core materials of various electronic components such as sensors, controllers, actuators and transducers due to their capability of conversion between mechanical energy and electric energy. Thus, such materials play in an important role in the fields of information technologies, optoelectronic technologies, precision control technologies, remote sensing imaging technologies and the like.

Since the 1960s, lead zirconate titanate (PZT) ceramic materials have been dominating the commercial application of piezoelectric materials due to their excellent piezoelectric properties, and as a key intelligent material, PZT has supported many important intelligent technologies. However, this kind of materials is toxic due to high lead content, thus bringing about serious environment pollution and ecological hazard, and threatening the human health while being widely used. With the increasing attention to environmental protection, various countries in the world have legislated extensively to prohibit or restrict the application of lead-bearing materials in the electronic industry.

Thus, lead zirconate titanate (PZT) is about to be prohibited by legislation in the world. However, a lead-free piezoelectric material system which can completely replace lead zirconate titanate (PZT) has not been developed. This situation is forming a looming crisis in the field of piezoelectric technology.

SUMMARY

To solve the above-mentioned problems, the present disclosure provides a method for obtaining lead-free piezoelectric materials, including:

Step S100, adjusting the T/O phase boundary of a first lead-free piezoelectric material:
for the first lead-free piezoelectric material, adjusting the T/O phase boundary between the tetragonal phase T and the orthorhombic phase O to be near the room temperature by doping;

Step S200, further adjusting the C/T phase boundary and the O/R phase boundary: further adjusting the C/T phase boundary between the cubic paraelectric phase C and the tetragonal phase T, and the O/R phase boundary between the orthorhombic phase O and the rhombohedral phase R by doping, so as to enable the C/T phase boundary and the O/R phase boundary to approach the T/O phase boundary; and Step S300, obtaining second lead-free piezoelectric materials: obtaining multiple second lead-free piezoelectric materials with different piezoelectric constants $d_{33}$ and different Curie temperatures $T_C$ in the process that the C/T phase boundary and the O/R phase boundary approach the T/O phase boundary.

In addition, the present disclosure further provides lead-free piezoelectric materials, characterized in that,
the T/O phase boundary between the tetragonal phase T and the orthorhombic phase O of the lead-free piezoelectric material is located near the room temperature; and
the C/T phase boundary between the cubic paraelectric phase C and the tetragonal phase T and the O/R phase boundary between the orthorhombic phase O and the rhombohedral phase R are both in a state of approaching the T/O phase boundary; wherein:
different degrees of phase boundary approaching are related to different piezoelectric constants $d_{33}$ and different Curie temperatures $T_C$ of the lead-free piezoelectric material.

In addition, the present disclosure further provides a preparation process of a lead-free piezoelectric material, used for preparing the lead-free piezoelectric material and including:
Step T001: selecting raw materials according to corresponding chemical general formulae and mixing them; and
Step T002: preparing the lead-free piezoelectric material by adopting a traditional solid-state sintering process.

In addition, the present disclosure further provides a method for obtaining lead-free piezoelectric materials, including:
Step S101, adjusting the T/O phase boundary of a first lead-free piezoelectric material:
for the first lead-free piezoelectric material, adjusting the T/O phase boundary between the tetragonal phase T and the orthorhombic phase O to be near the service temperature of the material by doping;

Step S201, further adjusting the C/T phase boundary and the O/R phase boundary:
further adjusting the C/T phase boundary between the cubic paraelectric phase C and the tetragonal phase T and the O/R phase boundary between the orthorhombic phase O and the rhombohedral phase R by doping, so as to enable the C/T phase boundary and the O/R phase boundary to approach the T/O phase boundary, wherein the phase boundary approaching includes:
the C/T phase boundary, the O/R phase boundary and the T/O phase boundary tend to converge to one point but cannot converge to this point; or
the C/T phase boundary, the O/R phase boundary and the T/O phase boundary converge to one point neither explicitly nor implicitly; and Step S301, obtaining second lead-free piezoelectric materials: obtaining second lead-free piezoelectric materials in the process that the C/T phase boundary and the O/R phase boundary approach the T/O phase boundary.

In addition, the present disclosure also provides a hard piezoelectric ceramic, characterized in that,
the hard piezoelectric ceramic is obtained based on the method for obtaining lead-free piezoelectric materials.
In addition, the present disclosure also provides a hard piezoelectric ceramic, characterized in that,
the hard piezoelectric ceramic is obtained based on the lead-free piezoelectric material.
In addition, the present disclosure also provides a high-energy converter, characterized in that,
the high energy converter adopts the hard piezoelectric ceramic.
In addition, the present disclosure also provides a soft piezoelectric ceramic, characterized in that,
the soft piezoelectric ceramic is obtained based on the method for obtaining lead-free piezoelectric materials.
In addition, the present disclosure also provides a soft piezoelectric ceramic, characterized in that,
the soft piezoelectric ceramic is obtained based on the lead-free piezoelectric material.
In addition, the present disclosure also provides a sensor, characterized in that,
the sensor adopts the soft piezoelectric ceramic.
In addition, the present disclosure also provides an actuator, characterized in that, the actuator adopts the soft piezoelectric ceramic.
In addition, the present disclosure also provides an electronic component, characterized in that,
the electronic component adopts the hard piezoelectric ceramic and/or the soft piezoelectric ceramic.
In addition, the present disclosure also provides an electronic device, characterized in that,
the electronic device adopts the hard piezoelectric ceramic and/or the soft piezoelectric ceramic.
The present disclosure has the following characteristics:
firstly, according to the method for obtaining lead-free piezoelectric materials described in the present disclosure, a considerable number of lead-free piezoelectric materials with different properties and high piezoelectric constants can be obtained, and are even expected to completely replace lead zirconate titanate (PZT) in various application scenarios;
secondly, the present disclosure can prepare the lead-free piezoelectric materials described in the present disclosure almost without improving the existing production line by using the existing preparation process of piezoelectric materials, and the method is even lower in sintering temperature, thus being more energy-saving and environmentally friendly.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
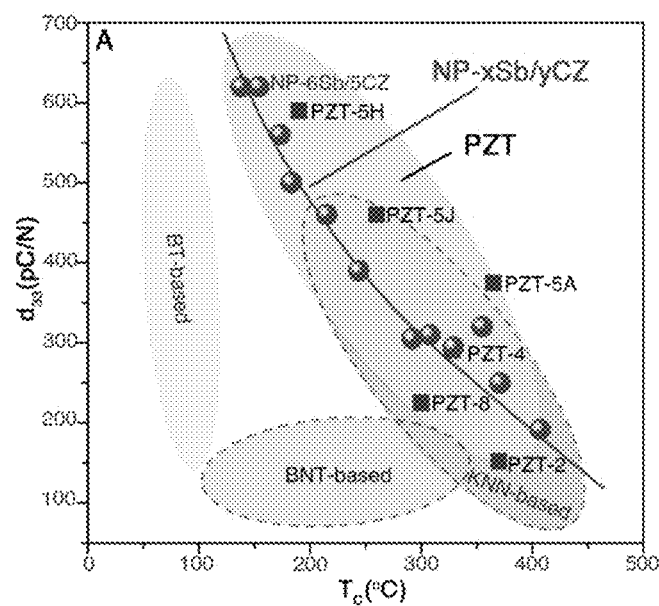
FIG. 1A is a comparison schematic diagram of piezoelectric properties (room temperature piezoelectric constant $d_{33}$) and Curie temperature ($T_C$) between an embodiment of the present disclosure and PZT series and other lead-free piezoelectric ceramic series in the prior art.

Embodiments will be further described in detail below in combination with the accompanying drawings.

In one embodiment, a method for obtaining lead-free piezoelectric materials is disclosed, and the method includes:

Step S100, adjusting the T/O phase boundary of a first lead-free piezoelectric material:
for the first lead-free piezoelectric material, adjusting the T/O phase boundary between the tetragonal phase T and the orthorhombic phase O to be near the room temperature by doping;

Step S200, further adjusting the C/T phase boundary and the O/R phase boundary: further adjusting the C/T phase boundary between the cubic paraelectric phase C and the tetragonal phase T and the O/R phase boundary between the orthorhombic phase O and the rhombohedral phase R by doping, so as to enable the C/T phase boundary and the O/R phase boundary to approach the T/O phase boundary; and Step S300, obtaining second lead-free piezoelectric materials: obtaining multiple second lead-free piezoelectric materials with different piezoelectric constants $d_{33}$ and different Curie temperatures $T_C$ in the process that the C/T phase boundary and the O/R phase boundary approach the T/O phase boundary.

The embodiment embodies the principle of the present disclosure. The inventors find in the research that for the lead-free piezoelectric material system generally having four different phases, there exist a cubic paraelectric phase (C), a tetragonal ferroelectric phase (T), an orthorhombic ferroelectric phase (O) and a rhombohedral ferroelectric phase (R). By adjusting the structure stability of each phase by doping, when the four different phase structures in the system gradually approach, lead-free piezoelectric materials with high piezoelectric constants and high Curie temperatures can be easily obtained. Due to the opposite trend of piezoelectric constant and Curie temperature, some of finally obtained lead-free piezoelectric materials tend to have high piezoelectric constants, and some tend to have high Curie temperatures.

Therefore, in this embodiment, in the process that the C/T phase boundary and the O/R phase boundary approach the T/O phase boundary, multiple second lead-free piezoelectric materials with different piezoelectric constants $d_{33}$ and different Curie temperatures $T_C$ are obtained, so as to meet the needs of various application scenarios. It is easy to understand that the second lead-free piezoelectric materials of the present embodiment are obtained based on the doping of the first lead-free piezoelectric material.

In another embodiment, more preferably, in the step S200, enabling the C/T phase boundary and the O/R phase boundary to approach the T/O phase boundary further includes the following situations:
the C/T phase boundary, the O/R phase boundary and the T/O phase boundary tend to converge to one point; or
the C/T phase boundary, the O/R phase boundary and the T/O phase boundary converge to one point neither explicitly nor implicitly.

For the embodiment, the inventors find that: the four different phase structures in the system gradually approach to one point (which is called multiphase coexistence point, denoted as MCP), which is more conducive to achieving the purpose of obtaining lead-free piezoelectric materials with high piezoelectric properties and high Curie temperature. The multiphase coexistence point mentioned in this embodiment refers to the point to which the C/T phase boundary, the O/R phase boundary and the T/O phase boundary tend to converge after linear extrapolation. It should be noted that: the C/T phase boundary, the O/R phase boundary and the T/O phase boundary directly converge to one point, which can also be understood as explicitly converging to one point, and the point can be denoted as explicit MCP; while after linear extrapolation, the C/T phase boundary, the O/R phase boundary and the T/O phase boundary tend to converge to one point, which can be understood as implicitly converging to one point, and the point can be denoted as implicit MCP.

In addition, as long as the method of the first embodiment is followed for finally enabling the C/T phase boundary and the O/R phase boundary to approach the T/O phase boundary, even if the different phase structures do not approach to one point (i.e., the C/T phase boundary, the O/R phase boundary and the T/O phase boundary converge to one point neither explicitly nor implicitly), the lead-free piezoelectric material with high piezoelectric properties and high Curie temperature can still be obtained. However, enabling different phase structures to approach to one point is more conducive to achieving the purpose of obtaining lead-free piezoelectric materials with high piezoelectric properties and high Curie temperature. For details, this is further explained by energy barrier and related pictures and texts.

In another embodiment, the first lead-free piezoelectric material includes a lead-free piezoelectric ceramic with a perovskite crystal type. Obviously, the embodiment gives a class of materials for the selection of the first lead-free piezoelectric material.

The comparison between the foregoing multiple embodiments and the prior art is very distinctive: the lead-free piezoelectric materials have been widely studied and some gratifying progress has been made, but a lead-free piezoelectric material series which is comparable to lead zirconate titanate PZT in piezoelectric properties and Curie temperature has not been found, see FIG. 1. What's more, no lead-free material can match the soft PZT ($d_{33}$ up to 600 pC/N and $T_C$ between 130° C. and 190° C.) which is praised as "the pearl on the crown". Because there is no lead-free piezoelectric substitutes, the whole piezoelectric material industry is facing a looming crisis.

Specifically, as far as FIG. 1 is concerned, FIG. 1 shows the excellent comprehensive properties of the novel lead-free piezoelectric system NP-xSb/yCZ obtained according to the above embodiment.

Wherein, for 1A to 1F in FIG. 1:
in (A), the piezoelectric properties (room temperature piezoelectric coefficient $d_{33}$) and Curie temperature ($T_C$) of NP-xSb/yCZ series, commercial PZT series and other lead-free piezoelectric ceramic series are compared. Wherein, BT refers to barium titanate, BNT refers to sodium potassium titanate, and KNN refers to potassium sodium niobate. As shown in (A), the commercial PZT series has both high $d_{33}$ and high $T_C$, and its comprehensive properties cannot be achieved by the current lead-free piezoelectric ceramics. The novel lead-free piezoelectric material series NP-xSb/yCZ is comparable with the PZT series in comprehensive properties;
in (B), the relationship between the room temperature permittivity and Curie temperature $T_C$ of NP-xSb/yCZ series, PZT series and other lead-free piezoelectric systems is compared. Similar to (A), in (B), NP-xSb/yCZ series still shows the performance that matches with the PZT series;

(C) shows the thermal cycling stability of the piezoelectric constants of the NP-xSb/yCZ series near the T-O phase boundary by taking NP-6Sb/5.5CZ as an example. The T-O phase transition temperature of the material is 10° C. After 1000 cycles between −50° C. and 80° C., the material still retains a very high piezoelectric constant up to 550 pC/N, thus showing excellent thermal cycling stability;

(D) shows the temperature stability of the piezoelectric constants of the NP-xSb/yCZ series. The NP-6Sb/0CZ can keep the piezoelectric constant of about 270 pC/N at 20° C. to 290° C. all the time, the piezoelectric constant of NP-6Sb/3CZ can be kept stable at 20° C. to 200° C. (~400 pC/N), and the NP-6Sb/5CZ can also keep a very high piezoelectric constant (400-600 pC/N) in a wide temperature range from 20° C. to 140° C.;

(E) shows a comparison result of an electrostrain curve of the key components in the present disclosure and the commercial piezoelectric ceramic PZT-5H. The piezoelectric coefficient $d_{33}$* of PZT-5H reaches 830 pm/V, but the piezoelectric loss is relatively large up to 27%; while the NP-Sb/CZ series has higher piezoelectric coefficient and lower piezoelectric loss. Wherein, the piezoelectric coefficient $d_{33}$* of NP-6Sb/5CZ is as high as 860 pm/V, while the piezoelectric loss is only 16%; while the piezoelectric coefficient $d_{33}$* of NP-6Sb/5.5CZ is as high as 980 pm/V, while the piezoelectric loss is only 14%;

(F) shows the excellent stability of properties including piezoelectric constant, permittivity, dielectric loss and phase angle of NP-xSb/yCZ series in a humidity environment by taking NP-6Sb/5CZ and NP-6Sb/5.5CZ as examples. In the one-month soaking experiment, all the performances are kept stable.

In another embodiment, the present disclosure further discloses a lead-free piezoelectric ceramic system which has properties that are comparable to the entire PZT family in terms of piezoelectric properties and Curie temperature, and the piezoelectric properties are as high as that of soft PZT. The ceramic series is of a perovskite structure, and can be obtained by a traditional solid-phase sintering method, and the chemical formula is as follows:

$$(99-y)[(K_{0.48}Na_{0.52})_{0.96}Li_{0.04}Nb_{1-x/100}Sb_{x/100}O_3]-1\\{}[(Bi_{0.5}K_{0.5})ZrO_3]-yCaZrO_3.$$

For convenience, the above chemical formula is abbreviated to NP-xSb/yCZ, wherein NP represents lead-free and x % and y % are the contents of the element antimony (Sb) and the chemical composition calcium zirconate ($CaZrO_3$), respectively.

Table 1 Comparison of piezoelectric coefficient ($d_{33}$), permittivity (ε), electromechanical coupling coefficient ($k_p$), dielectric loss (tan δ) and Curie temperature ($T_C$) of NP-xSb/yCZ series with commercial PZT. Wherein, the references of some data are as follows: T. R. Shrout, S. J. Zhang, Lead-free piezoelectric ceramics: Alternatives for PZT?.J.

| Composition | $d_{33}$ (pC/N) | ε | $k_p$ | tan δ | $T_C$ (° C.) |
|---|---|---|---|---|---|
| *Electroceram*. 19, 111-124 (2007) | | | | | |
| NP-6Sb/5.5CZ | 670 | 5410 | 0.61 | 0.032 | 135 |
| NP-6Sb/5CZ | 620 | 4611 | 0.63 | 0.032 | 155 |
| NP-6Sb/4.5CZ | 560 | 3250 | 0.54 | 0.042 | 173 |
| NP-6Sb/4CZ | 500 | 2752 | 0.52 | 0.046 | 183 |
| NP-6Sb/3CZ | 460 | 2096 | 0.56 | 0.038 | 215 |
| NP-6Sb/2CZ | 390 | 1966 | 0.56 | 0.032 | 244 |
| NP-6Sb/0CZ | 305 | 1208 | 0.57 | 0.027 | 292 |
| NP-5Sb/0CZ | 310 | 1355 | 0.5 | 0.035 | 308 |
| NP-4Sb/0CZ | 295 | 1270 | 0.49 | 0.030 | 329 |
| NP-3Sb/0CZ | 325 | 985 | 0.51 | 0.029 | 355 |
| NP-2Sb/0CZ | 250 | 1020 | 0.52 | 0.031 | 371 |
| NP-0Sb/0CZ | 190 | 850 | 0.48 | 0.037 | 407 |
| PZT-5H | 590 | 3400 | 0.65 | 0.02 | 190 |
| PZT-5J* | 460 | 2800 | 0.60 | 0.02 | 260 |
| PZT-8 | 225 | 1000 | 0.51 | 0.004 | 300 |
| PZT-4 | 290 | 1300 | 0.58 | 0.004 | 328 |
| PZT-5A | 375 | 1700 | 0.6 | 0.02 | 365 |
| PZT-2** | 152 | 450 | 0.47 | 0.01 | 370 |

Data with *come from http://www.sparklerceramics.com/piezoelectricproperties.html, and date with **come from http://www.ultrasonic-resonators.org/misc/references/articles/Berlincourt_'Properties_of_Morgan_Electro_Ceramic_Ceramics'_(Morgan_Technical_Publication_TP-226).pdf.

It can be seen that the system can almost completely cover the entire performance range of the PZT family in the $d_{33}$-$T_C$ performance diagram. Moreover, the composition point NP-6Sb/5CZ has high piezoelectric constant $d_{33}$ (up to 630 pC/N) and high Curie temperature $T_C$ (up to 155° C.), reaching the performance range of soft PZT.

Figure 1B:
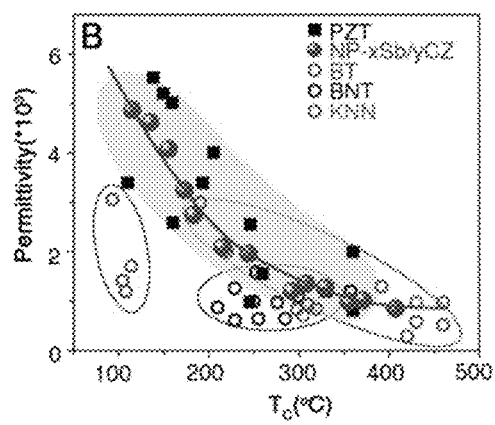
FIG. 1B is a comparison schematic diagram of permittivity (c) and Curie temperature ($T_C$) between an embodiment of the present disclosure and PZT series and other lead-free piezoelectric ceramic series in the prior art.
Figure 1C:
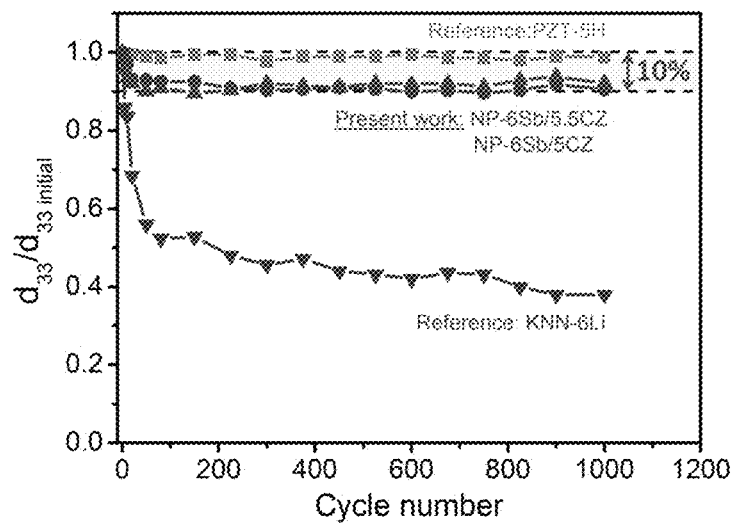
FIG. 1C is a thermal cycling stability schematic diagram of the piezoelectric constant near the T-O phase boundary in an embodiment of the present disclosure.
Figure 1D:
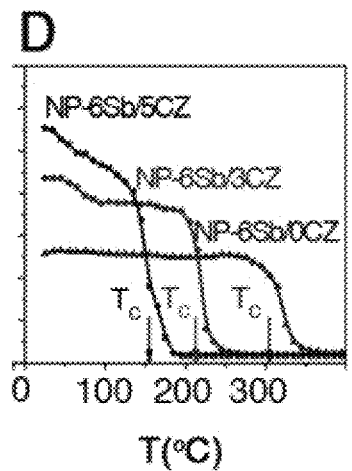
FIG. 1D is a temperature stability schematic diagram of the piezoelectric constant in an embodiment of the present disclosure.
Figure 1E:
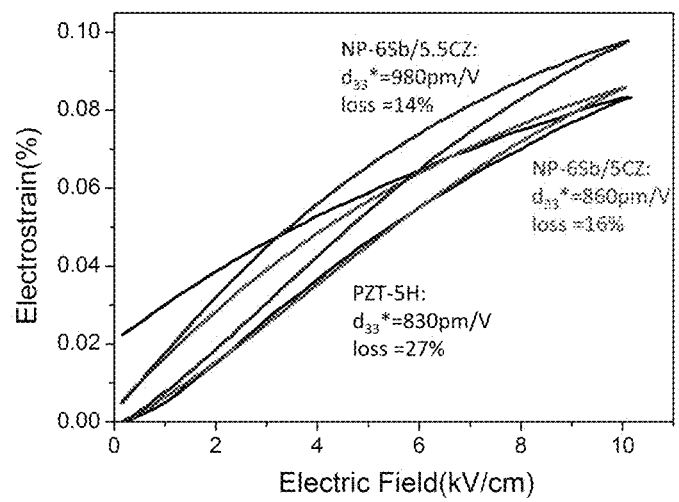
FIG. 1E is a comparison schematic diagram of an electrostrain curve between an embodiment of the present disclosure and a commercial piezoelectric ceramic PZT-5H.

In FIG. 1B, the dependence between room temperature permittivity of NP-xSb/yCZ and Curie temperature is comparable to that of PZT, and is much higher than that of other lead-free piezoelectric systems, such as barium titanate and sodium bismuth titanate. Therefore, the new system NP-xSb/yCZ is very similar to PZT in piezoelectric and ferroelectric properties, showing great potential to replace PZT.

Figure 1F:
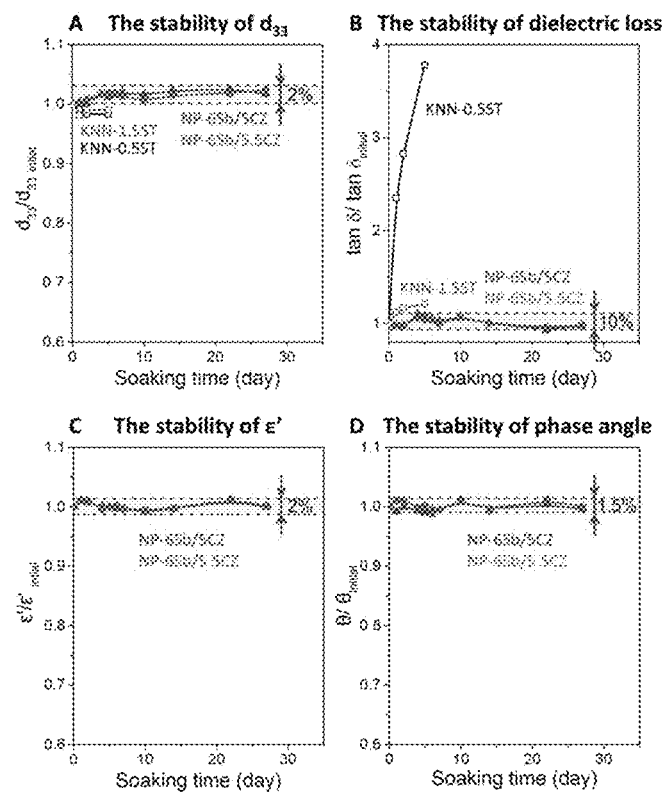
FIG. 1F is a schematic diagram of the stability of the piezoelectric constant, permittivity, dielectric loss and phase angle in a humidity environment (soaking experiment) of an embodiment of the present disclosure.

At the same time, the system exhibits good thermal cycling stability (FIG. 1C), temperature stability (FIG. 1D) and humidity insensitivity (FIG. 1F). It can be found from Table 1 that the properties of the NP-xSb/yCZ lead-free piezoelectric ceramic system are comparable to different commercial PZT (from soft PZT to hard PZT), thereby providing an effective alternative material for the whole PZT family. Moreover, the preparation process conditions of this series of ceramics are similar to those of PZT (see Table 2):

TABLE 2

Similarity of preparation conditions between NP series samples and PZT series samples, references: G. H. Haertling, Ferroelectric ceramics: History and technology. *J. Am. Ceram. Soc.* 82, 797-818 (1999)

| | NP-xSb/yCZ Series | PZT Series |
|---|---|---|
| Preparation Method | Solid phase reaction method | Solid phase reaction method |
| Presintering Temperature | 800-950° C. | 800-900° C. |
| Sintering Temperature | 1100-1200° C. | 1200-1300° C. |
| Crystal Type | Polycrystal | Polycrystal |

Therefore, a PZT ceramic series production line can be used to achieve large-scale production, which is conducive to the replacement of piezoelectric ceramics at lower cost.

To sum up, all the above excellent properties ensure that the NP-xSb/yCZ described in this disclosure is a very feasible material system to replace the entire PZT family.

In summary, the system is designed and obtained by optimizing the above-mentioned embodiment of "multiphase coexistence point" (also called as "approaching multiphase (coexistence) point").

Refer to FIG. 2A to 2D, which show the phase diagram, crystal structure, dielectric properties and microstructure of the NP-xSb/yCZ system, wherein:
(A) is the phase diagram of the NP-xSb/yCZ system, with obvious characteristics that the cubic, tetragonal, orthorhombic and rhombohedral phases gradually converge;
(B) is a diagram of identifying cubic, tetragonal, orthorhombic and rhombohedral phases by in-situ XRD (200) crystal face peaks at different temperatures;
(C) shows the change curve of the permittivity with temperature with the increase of the CZ content;
(D) shows the micro domain structures of NP-6Sb/0CZ, NP-6Sb/5CZ and NP-6Sb/6.5CZ at room temperature; all bright field TEM pictures are obtained when electron beams are in the 001 direction. With the increase of the CZ content, the ferroelectric domain gradually changes from a huge ferroelectric domain (0CZ) to a hierarchical ferroelectric domain structure (5CZ), and finally to a typical relaxor ferroelectric nano domain structure (6.5CZ).

Figure 2A:
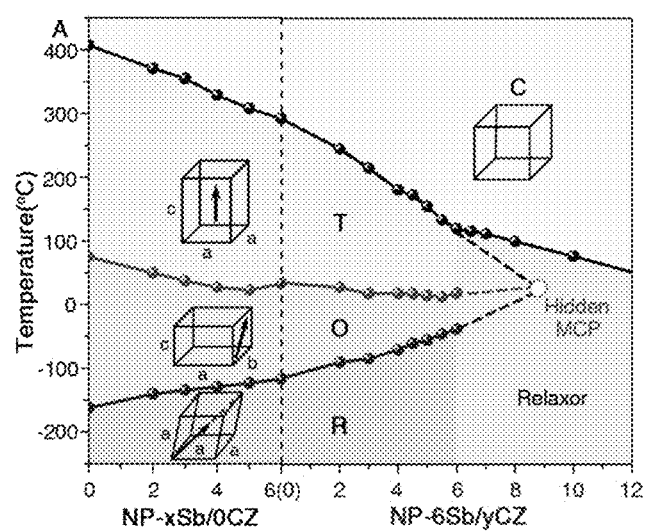
FIG. 2A is a phase diagram of the NP-xSb/yCZ system in an embodiment of the present disclosure.

Specifically, refer to FIG. 2A, the typical characteristics of the phase diagram of the system are that the cubic paraelectric phase (C), the tetragonal phase (T), the orthorhombic phase (O) and the rhombohedral phase (R) gradually approach with the increase of x and y, and the three phase boundaries also approach to one multiphase coexistence point simultaneously at the beginning. However, for this system, this trend of approaching multiphase coexistence point (also referred to as the multiphase point) is interrupted due to the appearance of relaxor ferroelectrics (y>6), so the multiphase coexistence point cannot be reached in this system (the multiphase coexistence point can be called "hidden multiphase coexistence point" or "hidden multiphase point" or "implicit MCP", and the opposite concept can be called "explicit MCP"). This fully shows that:

first, the approaching described in the present disclosure includes the situation that the C/T phase boundary, the O/R phase boundary and the T/O phase boundary tend to converge to one point, but cannot converge to this point (i.e., the hidden multiphase point or implicit MCP), which can be seen from the implicit convergence to one point mentioned above;

second, no matter whether different phase structures can converge to one point explicitly or implicitly, or cannot converge to one point explicitly or implicitly, as long as the C/T phase boundary and the O/R phase boundary approach the T/O phase boundary, lead-free piezoelectric materials with high piezoelectric properties and high Curie temperature can be obtained by following the method of the present disclosure. It is more advantageous to obtain lead-free piezoelectric materials with high piezoelectric properties and high Curie temperature when different phase structures can explicitly or implicitly converge to one point. In other words, the phase boundary approaching described in the present disclosure also includes: the C/T phase boundary, the O/R phase boundary, and the T/O phase boundary converge to one point neither explicitly nor implicitly. For details, see the energy barrier for further explanation.

Figure 2B:
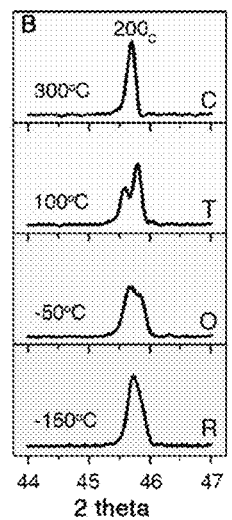
FIG. 2B is a schematic diagram of identifying cubic, tetragonal, orthorhombic and rhombohedral phases by in-situ XRD (200) crystal face peaks at different temperatures in one embodiment of the present disclosure.
Figure 2C:
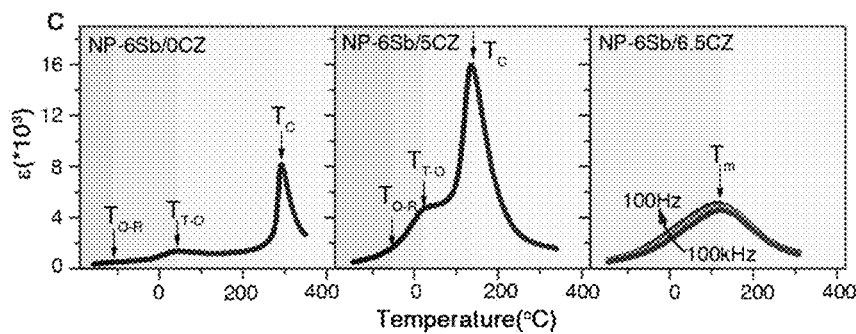
FIG. 2C shows permittivity vs. temperature curves with the increase of the CZ content in one embodiment of the present disclosure.

It should be noted that by linear extrapolation of the three phase boundaries, the "hidden multiphase coexistence point" can be determined to be near y=9. The in-situ XRD results as shown in FIG. 2B demonstrate the existence of four different phases. The three phase boundaries are obtained by the inflection points on the change curve of permittivity with temperature, see FIG. 2C and Table 2.

Figure 2D:
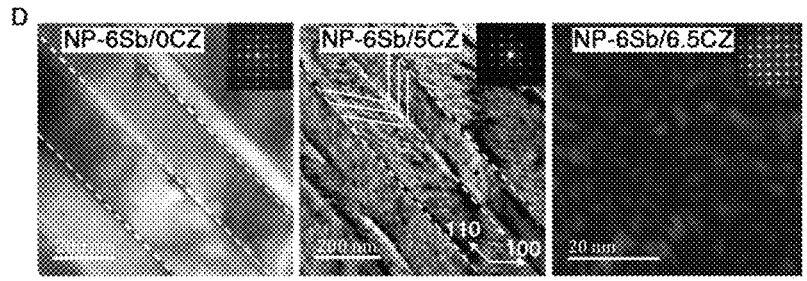
FIG. 2D shows microscopic domain structure of NP-6Sb/0CZ, NP-6Sb/5CZ and NP-6Sb/6.5CZ at room temperature.

As shown in FIG. 2D, with the increase of the content y of calcium zirconate, the three phase boundaries gradually approach one another, and the microstructure of domains near room temperature also presents interesting changes: from the huge ferroelectric domain at y=0 ($d_{33}$=305 pC/N) to the hierarchical ferroelectric domain structure at y=5 ($d_{33}$=630 pC/N), and finally to the typical nano domain structure of relaxor ferroelectrics at y=6.5 ($d_{33}$=55 pC/N). It can be seen that there is a clear correspondence between the morphology of domains and piezoelectric properties. In all piezoelectric systems, including lead-bearing and lead-free piezoelectric systems, hierarchical ferroelectric domain morphology is considered as a typical characteristic of high-performance piezoelectric materials. In the present disclosure, NP-6Sb/5.5CZ with a hierarchical ferroelectric domain structure has the highest $d_{33}$ in the series, up to 670 pC/N.

FIG. 3 shows the change trends of piezoelectric, dielectric, ferroelectric properties and phase transition hysteresis in the process of cubic, tetragonal, orthorhombic and rhombohedral phase transitions gradually approaching to converge, wherein
(A) is a three-dimensional contour chart of the piezoelectric coefficient in composition and temperature space. The piezoelectric coefficient gradually increases along the T/O phase boundary with the gradual convergence of cubic, tetragonal, orthorhombic and rhombohedral phase transitions, and finally reaches the maximum value, about 670 pC/N. After that, the system enters the relaxor ferroelectric region and loses its ferroelectricity, so its piezoelectric coefficient decreases rapidly. At the same time, it can be seen that in a composition-temperature region near the piezoelectric constant maximum value, extremely high piezoelectric constants are shown. This indicates that the system has relatively good composition and temperature stability;
(B) shows the change trends of the piezoelectric coefficient, permittivity, maximum polarization intensity, residual polarization intensity and coercive field at room temperature with the change of CZ composition. It can be seen that as the cubic, tetragonal, orthorhombic and rhombohedral phase transitions gradually approach to converge, the piezoelectric coefficient and permittivity of the system increase gradually, and reach the highest value before the system enters the relaxor ferroelectric region; while the maximum polarization intensity and residual polarization intensity remain basically unchanged, and decrease rapidly until the system enters the relaxor ferroelectric region; while the coercive field decreases gradually and increases slightly after the system enters the relaxor ferroelectric region. All in all, the system exhibits the highest permittivity, maximum polarization strength and residual polarization strength and minimum coercive field near 5.5CZ, which are consistent with the highest piezoelectric constant;
(C) shows the change trend of phase transition hysteresis with the change of CZ composition. It can be seen that the phase transition hysteresis decreases gradually with the gradual convergence of cubic, tetragonal, orthorhombic and rhombohedral phase transitions, which indicates that the energy barrier of ferroelectric phase transition in the system is gradually weakened, so the transition between the various phases is easier.

The gradual weakening of the energy barrier of the ferroelectric phase transition is exactly the physical mechanism behind the method for obtaining lead-free piezoelectric materials described in the present disclosure: for the method disclosed in the present disclosure, the gradual weakening of the energy barrier will cause the mutual transition between ferroelectric phases to become easier, which is conducive to obtaining high piezoelectric properties. Obviously, the method for obtaining lead-free piezoelectric materials described in the present disclosure is universal, independent of the specific system and type of the material, and in fact, is independent of the temperature corresponding to the T/O phase boundary, which will be further described later.

That is to say, although the present disclosure lists the situation that the first lead-free piezoelectric material includes a lead-free piezoelectric ceramic with a perovskite crystal type, and the second lead-free piezoelectric material includes a lithium sodium potassium niobate based ternary lead-free piezoelectric ceramic or a barium titanate based ternary lead-free piezoelectric ceramic, the present disclosure is not limited to specific systems and types of materials. This will be explained in detail later.

Figure 3A:
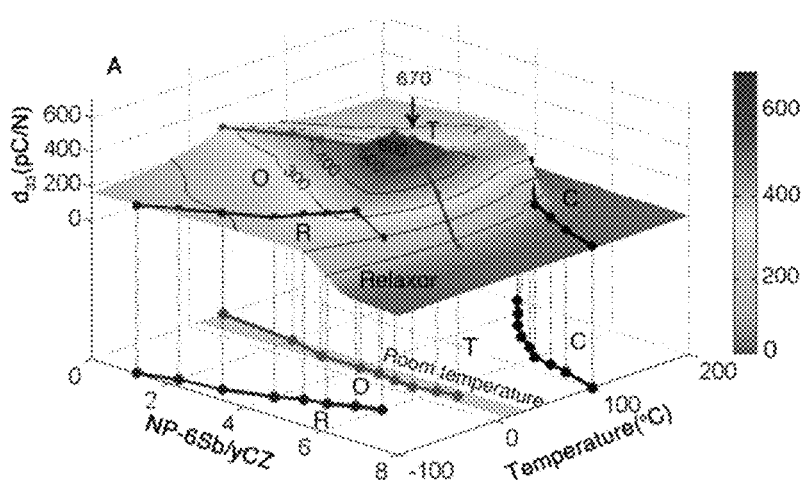
FIG. 3A is a three-dimensional contour chart of the piezoelectric coefficient in composition and temperature space in one embodiment of the present disclosure.

Specifically, as shown in FIG. 3A, there is a strong relationship between the piezoelectric coefficient $d_{33}$ of the NP-6Sb/yCZ system and the convergence trend of C/T/O/R phase boundaries. With the increase of the CZ content y, the three phase boundaries gradually converge. At the same time, the value of the piezoelectric coefficient $d_{33}$ increases from 305 pC/N (y=0) to 670 pC/N (y=5.5). Then, the system enters the relaxor ferroelectric region (Y>6), and its piezoelectric coefficient $d_{33}$ decreases rapidly to 0 therewith. It is worth noting that with the gradual convergence of the three phase boundaries, the piezoelectric coefficient $d_{33}$ maintains a high $d_{33}$ value of 400 pC/N or above in a wide composition range (2<y<6) and a wide temperature range (for example, for NP-6Sb/5CZ, its $T_C$ is equal to 155° C., and its $d_{33}$ can be maintained at 400 pC/N or above in a range of −40° C.-150° C.). This important characteristic of the system ensures that the piezoelectric coefficient $d_{33}$ of the system can maintain a relatively high value in the wide temperature and composition range, which indicates that the whole system becomes quite "soft" in a region close to the multiphase coexistence point MCP. However, the relaxor ferroelectrics destroy the ferroelectricity of the system due to the fact that as the system enters the relaxor ferroelectric region, its piezoelectric coefficient decreases rapidly and disappears.

Thus, the property ($d_{33}$>600 pC/N) similar to soft PZT can appear at the boundary closest to the MCP but not becoming the relaxor ferroelectric region, such as NP-6Sb/5CZ.

Figure 3B:
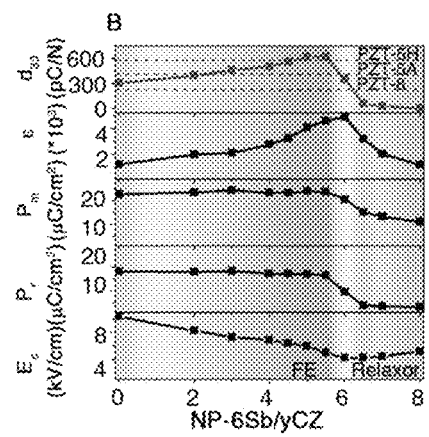
FIG. 3B is a change trend schematic diagram of the piezoelectric constant, permittivity, maximum polarization intensity, residual polarization strength and coercive field at room temperature with the change of CZ composition.

In FIG. 3B, besides the piezoelectric coefficient $d_{33}$, the dielectric and ferroelectric properties of the system increase rapidly along with the gradual convergence of the C/T/O/R phase boundaries. As the CZ content y increases from 0 to 5.5, the room temperature $d_{33}$ of the system is doubled from 305 pC/N to 670 pC/N, which is even higher than the famous PZT-5H ($d_{33}$~590 pC/N), however, when y is larger than 6, the system enters the relaxor ferroelectric region, and its $d_{33}$ decreases rapidly therewith. Similar to change of $d_{33}$ with the composition, the room temperature dielectric coefficient maximum value ε (~4600), the spontaneous polarization maximum value Pm (24 μC/cm²), the residual polarization maximum value Pr (17 μC/cm²) and the coercive field minimum value Ec (~5 kV/cm) of the system all appear near y (~5.5).

Figure 3C:
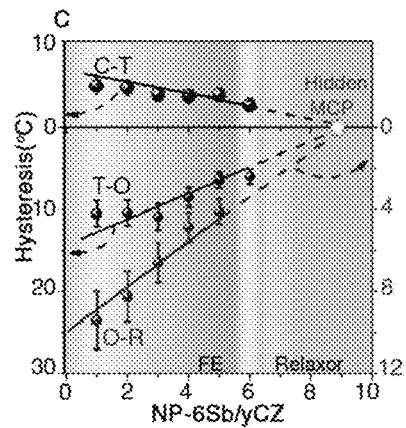
FIG. 3C shows the variation of phase transition hysteresis with the change of CZ composition in an embodiment of the present disclosure.

In the process that the C/T/O/R three phase boundaries gradually converge to the multiphase coexistence point (MCP) with the increase of y, the thermal hysteresis of C-T, T-O and O-R phase transitions (see Fig. S3 for the definition of phase transition thermal hysteresis) gradually decreases and tends to zero near the hidden multiphase coexistence point (MCP), as shown in FIG. 3C. However, due to the formation of the relaxor ferroelectrics near y=6, the decreasing trend of the phase transition thermal hysteresis is blocked, but does not really disappear. The gradual disappearance of phase transition thermal hysteresis indicates that the three first-order transitions tend to be continuous transition (8) when approaching to the multiphase coexistence point (MCP). This indicates that the energy barrier among the four phases gradually disappears near the multiphase coexistence point MCP. According to the physical mechanism behind the present disclosure, much higher performance than 670 pC/N can be obtained near the multiphase coexistence point MCP without the barrier of relaxor ferroelectrics.

In order to further verify the hypothesis that the multiphase coexistence point MCP can form ultra-high $d_{33}$ and the MCP's carrying effect in this respect can form a high $d_{33}$ region of 500-600 pC/N near MCP, another lead-free piezoelectric system is designed in another embodiment: $BaTiO_{3-x}(Ba_{0.5}Ca_{0.5})SnO_3$ (abbreviated as BT-BCS).

FIG. 4A-4E show the comparison of the enhancement effect of piezoelectric properties of two piezoelectric systems with explicit MCP and implicit MCP, wherein (A) is the phase diagram of the $BaTiO_3$-x$(Ba_{0.5}Ca_{0.5})SnO_3$ (BT-xBCS) system with explicit MCP. In the diagram, the cubic, tetragonal, orthorhombic and rhombohedral phase transitions gradually approach and converge to one multiphase coexistence point;

(B) is the contour chart of piezoelectric properties of the BT-xBCS system in composition and temperature space. It can be seen that the piezoelectric constant increases along the T/O phase boundary as the four phases approach, and an unprecedented ultra-high $d_{33}$, up to 1120 pC/N, is obtained near the multiphase coexistence point. This is the highest value of all piezoelectric ceramics reported so far;

(C) is the phase diagram of the $BaTiO_{3-x}Ba(Mg_{1/3}Nb_{2/3})O_3$(BT-xBMN) system with implicit MCP. In the diagram, the cubic, tetragonal, orthorhombic and rhombohedral phase transitions are still gradually approaching one another to converge, but the system has entered the relaxor ferroelectric region before the cubic, tetragonal, orthorhombic and rhombohedral phase transitions converge to one multiphase coexistence point. Therefore, the system represented by this phase diagram has no explicit MCP in fact, but only an implicit MCP obtained by linear extension of phase boundaries;

(D) is the contour chart of piezoelectric properties of the BT-xBMN system in composition and temperature space. Similar to the phase diagram with explicit MCP, the piezoelectric constant of the system gradually increases along the T/O phase boundary as the four phases approach. However, different from the system with explicit MCP, the piezoelectric constant of the BT-xBMN system decreases rapidly as the system enters the relaxor ferroelectric region, so the maximum value of $d_{33}$ appears near the ferroelectric/relaxor ferroelectric boundary, rather than at the implicit MCP;

(E) shows the three-dimensional free energy diagram of the system with explicit MCP. (i) shows the isotropic Landau free energy at MCP. (ii) shows that the free energy near MCP shows weak anisotropy. (iii) shows that the free energy far from MCP shows strong anisotropy. FT, FO and FR represent the free energies of tetragonal T, orthorhombic O and rhombohedral R phases respectively. R1 and R2 represent two different rhombohedral domains, respectively.

Figure 4A:
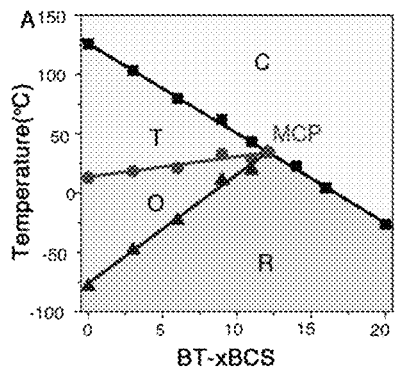
FIG. 4A is a phase diagram of a BT-xBCS system in an embodiment of the present disclosure.

Specifically, see FIG. 4A, the system has an MCP that is not blocked by relaxor ferroelectrics (FIG. 4A). The BT-BCS system with MCP shows a very interesting result: as the system continuously approaches MCP, its $d_{33}$ increases all the time, and an unprecedented $d_{33}$ value up to 1120 pC/N appears near MCP, which is the highest value reported so far in all polycrystalline piezoelectric ceramics including lead-bearing systems. It should be noted that the region with a high $d_{33}$ value of 500 pC/N or above can be extended to a very wide composition range (6<x<11), which is due to the carrying effect of MCP, which will be further explained below. Therefore, the ultra-high $d_{33}$ value at MCP and the great improvement of piezoelectric properties near MCP further prove that MCP is indeed a favorable factor for significant performance improvement.

However, as explained by the energy barrier in this disclosure, the inventor needs to point out that even if approaching to the multiphase coexistence point MCP is not realized by doping, only the following operation is carried out: the C/T phase boundary between the cubic paraelectric phase C and the tetragonal phase T and the O/R phase boundary between the orthorhombic phase O and the rhombohedral phase R are adjusted so that the C/T phase boundary and O/R phase boundary are enabled to approach the T/O phase boundary; multiple second lead-free piezoelectric materials with different piezoelectric constants $d_{33}$ and Curie temperatures $T_C$ can still be obtained in the process that the C/T phase boundary and the O/R phase boundary approach the T/O phase boundary.

Figure 4B:
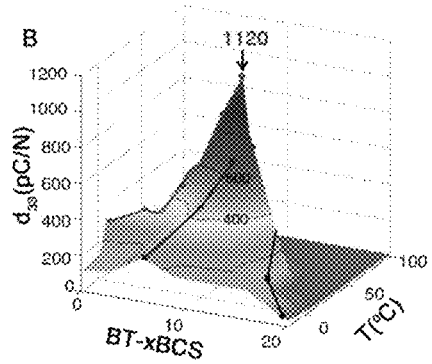
FIG. 4B is a contour chart of piezoelectric properties of a BT-xBCS system in composition and temperature space in one embodiment of the present disclosure.
Figure 4C:
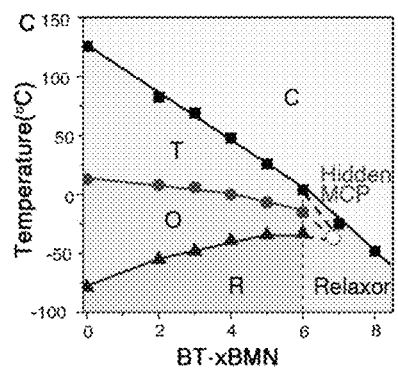
FIG. 4C is a phase diagram of a BT-xBMN system in an embodiment of the present disclosure.

In order to further simulate a situation similar to that in the NP-xSb/yCZ system where MCP is blocked by relaxor ferroelectrics to be "hidden", another lead-free piezoelectric system, $BaTiO_{3-x}Ba(Mg_{1/3}Nb_{2/3})O_3$ (abbreviated as BT-BMN), is designed in the present disclosure (FIG. 4C). The MCP of the system is blocked by relaxor ferroelectrics. Interestingly, the system shows the results similar to those of NP-xSb/yCZ, namely the piezoelectric properties gradually increase as the system approaches MCP and decrease rapidly after the system enters the relaxor ferroelectric region. The maximum value (~500 pC/N) of $d_{33}$ appears at the junction component BT-6MN of ferroelectrics/relaxor ferroelectrics. This is exactly the same as that of NP-xSb/yCZ in FIG. 3A. Obviously, whether MCP is blocked by relaxor ferroelectrics or not, the method of "approaching MCP" is very effective for improving piezoelectric properties. It can be seen that this method is still effective even when MCP is blocked by relaxor ferroelectrics, such as NP-xSb/yCZ. Therefore, this is an important method to design and obtain new piezoelectric materials with high performance. The physical mechanism behind the material design method is described in detail in FIG. 4E; it can be found that the physical mechanism is universal and independent of the specific material system.

Figure 4D:
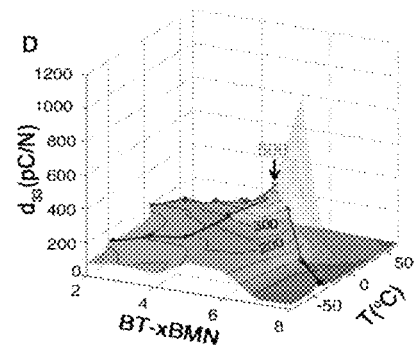
FIG. 4D is a contour chart of piezoelectric properties of a BT-xBMN system in composition and temperature space in one embodiment of the present disclosure.
Figure 4E:
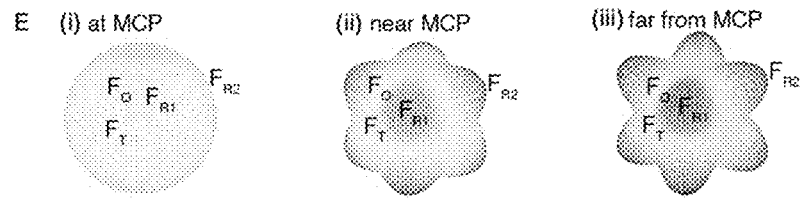
FIG. 4E is a three-dimensional free energy schematic diagram of a system with explicit MCP in one embodiment of the present disclosure.

At MCP, the phase equilibrium relationship among the four phases C, T, 0 and R results in isotropic free energy surface, that is, there is no energy barrier among the four phases C/T/O/R and in the domain between the four phases, as shown in FIG. 4E (i). This can also be seen as the disappearance of the degree of freedom of the system. On this basis, the ultra-high $d_{33}$ value (>1100 pC/N) near MCP can be explained, as shown in FIG. 4B. When the composition deviates slightly from MCP, such as NP-6Sb/4~5.5CZ, BT-9BCS and BT-6BMN, the energy barriers of phase transition and domain switching gradually increase, but still remain at a low level, and the free energy surface shows slight fluctuations, as shown in FIG. 4E (ii). Due to the fringing effect of MCP, that is, the large piezoelectricity appears not only at MCP, but also in a wide range of composition and temperature near MCP. The corresponding $d_{33}$ values of the above compositions remain at a relatively high level of 500-600 pC/N. Since the anisotropy of the free energy at this time is very small, the domain boundary energy is also very small, which explains why the observed domain is (26) of the hierarchical structure shown in FIG. 2D (5CZ). When the composition is far from MCP, such as NP-6Sb/0-2CZ, BT-3BCS and BT-2BMN, the phase boundary energy barrier and the domain switching energy barrier become very large, and the free energy surface shows a large anisotropy. As shown in FIG. 4E (iii), the corresponding $d_{33}$ decreases to 300-400 pC/N. Due to the high anisotropy of free energy, the corresponding domain boundary energy is also very high, resulting in the appearance of larger domains as shown in FIG. 2D (0CZ). In FIG. 3A and FIG. 4D, the appearance of MCP (and its accompanying ultra-high $d_{33}$) is blocked by relaxor ferroelectrics, and the highest value (500-600 pC/N) of $d_{33}$ appears at the junction of the ferroelectric phase and relaxor ferroelectrics. The above theoretical analysis proves that the new method embodied in the above-mentioned embodiments is an effective method to obtain high-performance piezoelectric materials. The greater the piezoelectric property is, the more it appears near the MCP.

To sum up, the novel lead-free piezoelectric system NP-xSb/yCZ is successfully obtained in this disclosure. The system covers the performance range of $d_{33}$-$T_C$ of the whole PZT family including soft PZT.

In another embodiment, the second lead-free piezoelectric materials include: lithium sodium potassium niobate based ternary lead-free piezoelectric ceramics. It is easy to understand that this embodiment is intended to define a specific class of lead-free piezoelectric materials to be obtained.

In another embodiment, near room temperature is about 20° C.-30° C. Or more broadly, in another embodiment, near room temperature is about 10° C.-40° C. Obviously, whether the temperature is about 20° C.-30° C. or 10° C.-40° C., the purpose is to obtain lead-free piezoelectric materials working in corresponding temperature ranges, which involves the working temperature or service temperature of the materials. See the following for details. Finally, it should be noted that the above-mentioned novel NP-xSb/yCZ lead-free piezoelectric systems and BT-BCS and BT-BMN lead-free piezoelectric systems are only three examples obtained by using the material design method described in the present disclosure. Through the description of the physical mechanism behind the above methods, it is easy to understand that the method of the present disclosure is universal in lead-free piezoelectric systems such as KNN-based lead-free piezoelectric systems and BT-based lead-free piezoelectric systems, and does not depend on the specific lead-free piezoelectric material system. Therefore, the material design method of the present disclosure is not related to the specific lead-free piezoelectric material system and should not be limited by the specific piezoelectric material system mentioned above. Furthermore, in the step S100, for the first lead-free piezoelectric material, the T/O phase boundary between the tetragonal phase T and the orthorhombic phase O is adjusted to be near a certain temperature by doping, and the certain temperature is not limited to room temperature. Referring to FIG. 4C, the T/O phase boundary can be adjusted to be near the service temperature of the material (service temperature, also known as working temperature), for example: about −20° C.-20° C. in FIG. 4C. Then, in combination with other embodiments of the present disclosure, the situation that near room temperature is about 10°

C.-40° C., and the physical mechanism behind the embodiment of the present disclosure described above, it can be understood that:

first, in the step S100, for the first lead-free piezoelectric material, the T/O phase boundary between the tetragonal phase T and the orthorhombic phase O is adjusted to be near a certain temperature by doping, and the certain temperature can cover a relatively wide range of −20° C.-40° C.; in order to introduce as less new conception as possible, −20° C.-40° C. is sometimes classified as near the room temperature in the present disclosure, namely, the range of room temperature is enlarged.

secondly, further, in the step S100, for the first lead-free piezoelectric material, the T/O phase boundary between the tetragonal phase T and the orthorhombic phase O is adjusted to be near a certain temperature by doping, and the certain temperature can cover above 40° C. or below −20° C., as long as the first lead-free piezoelectric material can meet the service temperature (also known as the working temperature) of above 40° C. or below −20° C.;

thirdly, the embodiments disclosed in the present disclosure are not only universal and do not depend on a specific lead-free piezoelectric material system, but also are not limited by a certain temperature. The reason why the certain temperature can be room temperature, or −20° C.-40° C. or 40° C. or above is that on one hand, the T/O phase boundary of different first lead-free piezoelectric materials will have different corresponding temperature ranges, and on the other hand, the lead-free piezoelectric materials finally obtained through the embodiment of the present disclosure can meet the requirements of users for the service temperature.

Therefore, the present disclosure also discloses a method for obtaining lead-free piezoelectric materials, including:

Step S101, adjusting the T/O phase boundary of a first lead-free piezoelectric material:

for the first lead-free piezoelectric material, adjusting the T/O phase boundary between the tetragonal phase T and the orthorhombic phase O to be near the service temperature of the material by doping;

Step S201, further adjusting the C/T phase boundary and the O/R phase boundary: further adjusting the C/T phase boundary between the cubic paraelectric phase C and the tetragonal phase T and the O/R phase boundary between the orthorhombic phase O and the rhombohedral phase R by doping, so as to enable the C/T phase boundary and the O/R phase boundary to approach the T/O phase boundary, wherein the phase boundary approaching includes:

the C/T phase boundary, the O/R phase boundary and the T/O phase boundary tend to converge to one point, but cannot converge to this point; or the C/T phase boundary, the O/R phase boundary and the T/O phase boundary converge to one point neither explicitly nor implicitly; and Step S301, obtaining a second lead-free piezoelectric material:

obtaining the second lead-free piezoelectric material in the process that the C/T phase boundary and the O/R phase boundary approach the T/O phase boundary.

In another embodiment, the said near the service temperature includes one of the following: −20° C.-40° C., above 40° C. or below −20° C.

In another embodiment, the second lead-free piezoelectric material includes: a lithium sodium potassium niobate based ternary lead-free piezoelectric ceramic or a barium titanate based ternary lead-free piezoelectric ceramic.

In another embodiment, a general formula for a composition of the second lead-free piezoelectric material is represented by:

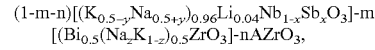

wherein in the formula, $0 \leq m \leq 0.02$, $0 \leq n \leq 0.1$, $0 \leq x \leq 0.07$, $0 \leq y \leq 0.1$, $z = 0, 1$, and A is selected from one or a combination of the following divalent metal ions: Ca, Mg and Ba; or $(1-x-y)BaTiO_3$-$x(Ba_{0.5}Ca_{0.5})SnO_3$-$yBa(Mg_{1/3}Nb_{2/3})O_3$,
wherein in the formula, $0 \leq x \leq 0.2$, and $0 \leq y \leq 0.1$.

In another embodiment, the method for obtaining the lead-free piezoelectric ceramics and the lithium sodium potassium niobate based ternary lead-free piezoelectric ceramics and barium titanate based ternary lead-free piezoelectric ceramics obtained by the method will be further described. It is necessary to point out that the examples are only used for further explanation of the present disclosure, but should not be understood as any limitation on the scope of protection of the present disclosure, those skilled in the art may make some non essential improvements and adjustments based on the principles of the present disclosure and the contents of the present disclosure.

In the following embodiments, the performance parameters of $d_{33}$, $T_C$, $\varepsilon_r$, $\tan \delta$ and $k_p$ obtained under specific preparation process conditions of lithium sodium potassium niobate based ternary lead-free piezoelectric ceramics and barium titanate based ternary lead-free piezoelectric ceramics with different compositions are given:

Embodiments of a Group A

Proportioning is carried out according to the lithium sodium potassium niobate based ternary lead-free piezoelectric ceramic content represented by the general formula:

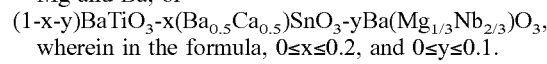

when x=0, y=0.02, z=0, m=0.01, and n=0, a first formula is:

$0.99(K_{0.48}Na_{0.52})_{0.96}Li_{0.04}NbO_3$-$0.01Bi_{0.5}K_{0.5}ZrO_3$;

when x=0.02, y=0.02, z=0, m=0.01, and n=0, a second formula is:

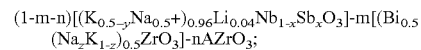

when x=0.03, y=0.02, z=0, m=0.01, and n=0, a third formula is:

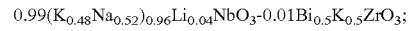

when x=0.04, y=0.02, z=0, m=0.01, and n=0, a fourth formula is:

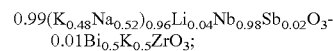

when x=0.05, y=0.02, z=0, m=0.01, and n=0, a fifth formula is:

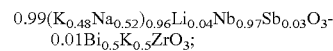

when x=0.06, y=0.02, z=0, m=0.01, and n=0, a sixth formula is:

$$0.99(K_{0.48}Na_{0.52})_{0.96}Li_{0.04}Nb_{0.94}Sb_{0.06}O_3\text{-}0.01Bi_{0.5}K_{0.5}ZrO_3;$$

For the group of embodiments, the preparation of first to sixth formulae includes the steps of:

accurately weighing analytically pure sodium carbonate, potassium carbonate, lithium carbonate, niobium pentoxide, antimony trioxide, bismuth oxide and zirconia serving as raw materials by weight percentage;

performing ball-milling mixing on the prepared raw materials by taking anhydrous ethanol as a ball-milling medium for 8-12 hours in a planetary ball mill, then drying to obtain mixed dry powder, and keeping the temperature of the mixed dry powder at 850-1000° C. for 3-6 hours and conducting presintering;

after the powder is broken, performing ball milling on the broken powder by taking anhydrous ethanol as the ball milling medium for 6-10 hours in the planetary ball mill again, and then drying to obtain dry powder;

adding a 5-10 wt % polyvinyl alcohol aqueous solution into the obtained dry powder and conducting granulation;

mould pressing the granulated powder into small round pieces with the diameter of 8 mm and the thickness of 1-3 mm, and performing binder discharging on the small round pieces;

keeping the temperature of the small round pieces subjected to binder discharging at 1060-1160° C. for 3-10 hours and conducting sintering to obtain ceramic plates;

coating the ceramic plates obtained by sintering with a silver electrode;

polarizing the silver coated ceramic plates in silicone oil at room temperature under an electric field with the electric field intensity of 3-4 kV/mm for 30-60 minutes;

obtaining the lithium sodium potassium niobate based ternary lead-free piezoelectric ceramics with high piezoelectric constant and high Curie temperature after polarization is completed;

enabling the lithium sodium potassium niobate based ternary lead-free piezoelectric ceramic to stand in air for 24 hours, and then performing electrical property measurement according to the IEEE standard.

Figure 5:
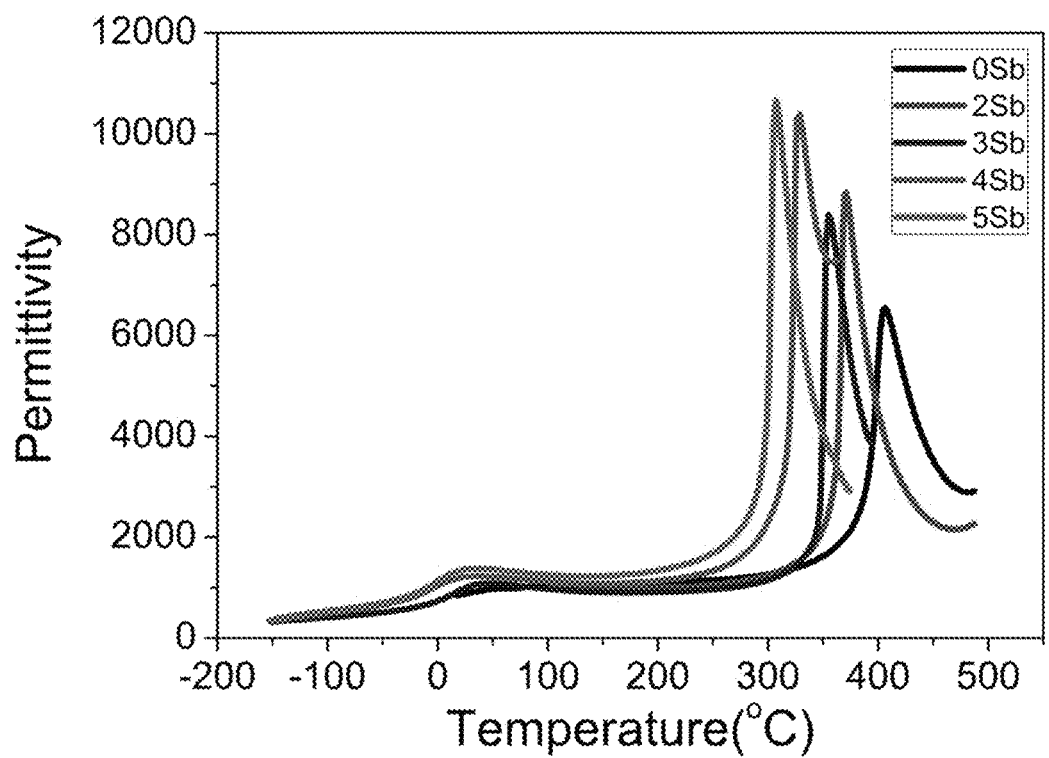
FIG. 5 shows the variation of relative permittivity $\varepsilon_r$ of a lead-free piezoelectric ceramic with temperature at 10 kHz in one embodiment of the present disclosure.

When x=0, 0.02, 0.03, 0.04 and 0.05 which are variable values, and y=0.02, z=0, m=0.01, and n=0 which are fixed values during preparation in the group of embodiments:

the change curve of the relative permittivity $\varepsilon_r$ of 0.99 $(K_{0.48}Na_{0.52})_{0.96}Li_{0.04}Nb_{1-x}Sb_xO_3$-$0.01Bi_{0.5}K_{0.5}ZrO_3$ lead-free piezoelectric ceramics with temperature at 10 kHz is shown in FIG. 5. It can be seen that after Sb doping, the Curie temperature $T_C$ of the system decreases gradually, while the T/O phase transition temperature decreases slightly; therefore, the C/T phase boundary and the T/O phase boundary approach each other.

The first to sixth formulae of the group of embodiments are sintered at different temperatures, and polarized in silicone oil with different heat preservation time and temperatures, and the electrical properties of the obtained lead-free piezoelectric ceramics tested by the IEEE standard are shown in Table 3.

TABLE 3

Related properties of lead-free piezoelectric ceramics from the first to sixth formulae at room temperature

| x | $d_{33}$ (pC/N) | $k_p$ | $\varepsilon_r$ (10 kHz) | tan δ | $T_C$ (° C.) |
|---|---|---|---|---|---|
| 0 | 190 | 0.48 | 850 | 0.037 | 407 |
| 0.02 | 250 | 0.52 | 1020 | 0.031 | 371 |
| 0.03 | 325 | 0.51 | 985 | 0.029 | 355 |
| 0.04 | 295 | 0.49 | 1270 | 0.030 | 329 |
| 0.05 | 310 | 0.5 | 1355 | 0.035 | 308 |
| 0.06 | 305 | 0.57 | 1208 | 0.027 | 292 |

Embodiments of a Group B

Proportioning is carried out according to the lithium sodium potassium niobate based ternary lead-free piezoelectric ceramic content represented by the general formula:

$$(1-m-n)[(K_{0.5-y}Na_{0.5+y})_{0.96}Li_{0.04}Nb_{1-x}Sb_xO_3]\text{-}m[(Bi_{0.5}(Na_zK_{1-z})_{0.5}ZrO_3]\text{-}nAZrO_3;$$

when A=Ca, x=0.06, y=0.02, z=0, m=0.01, and n=0.02, a first formula is:

$$0.97(K_{0.48}Na_{0.52})_{0.96}Li_{0.04}Nb_{0.94}Sb_{0.06}O_3\text{-}0.01Bi_{0.5}K_{0.5}ZrO_3\text{-}0.02CaZrO_3;$$

when A=Ca, x=0.06, y=0.02, z=0, m=0.01, and n=0.03, a second formula is:

$$0.96(K_{0.48}Na_{0.52})_{0.96}Li_{0.04}Nb_{0.94}Sb_{0.06}O_3\text{-}0.01Bi_{0.5}K_{0.5}ZrO_3\text{-}0.03CaZrO_3;$$

when A=Ca, x=0.06, y=0.02, z=0, m=0.01, and n=0.04, a third formula is:

$$0.95(K_{0.48}Na_{0.52})_{0.96}Li_{0.04}Nb_{0.94}Sb_{0.06}O_3\text{-}0.01Bi_{0.5}K_{0.5}ZrO_3\text{-}0.04CaZrO_3;$$

when A=Ca, x=0.06, y=0.02, z=0, m=0.01, and n=0.045, a fourth formula is:

$$0.945(K_{0.48}Na_{0.52})_{0.96}Li_{0.04}Nb_{0.94}Sb_{0.06}O_3\text{-}0.01Bi_{0.5}(0.5ZrO_3\text{-}0.045CaZrO_3;$$

when A=Ca, x=0.06, y=0.02, z=0, m=0.01, and n=0.05, a fifth formula is:

$$0.94(K_{0.48}Na_{0.52})_{0.96}Li_{0.04}Nb_{0.94}Sb_{0.06}O_3\text{-}0.01Bi_{0.5}K_{0.5}ZrO_3\text{-}0.05CaZrO_3;$$

when A=Ca, x=0.06, y=0.02, z=0, m=0.01, and n=0.055, a sixth formula is:

$$0.935(K_{0.48}Na_{0.52})_{0.96}Li_{0.04}Nb_{0.94}Sb_{0.06}O_3\text{-}0.01Bi_{0.5}(0.5ZrO_3\text{-}0.055CaZrO_3;$$

when A=Ca, x=0.06, y=0.02, z=0, m=0.01, and n=0.06, a seventh formula is:

$$0.93(K_{0.48}Na_{0.52})_{0.96}Li_{0.04}Nb_{0.94}Sb_{0.06}O_3\text{-}0.01Bi_{0.5}K_{0.5}ZrO_3\text{-}0.06CaZrO_3;$$

when A=Ca, x=0.06, y=0.02, z=0, m=0.01, and n=0.065, an eighth formula is:

$$0.925(K_{0.48}Na_{0.52})_{0.96}Li_{0.04}Nb_{0.94}Sb_{0.06}O_3\text{-}0.01Bi_{0.5}(0.5ZrO_3\text{-}0.065CaZrO_3;$$

when A=Ca, x=0.06, y=0.02, z=0, m=0.01, and n=0.07, a ninth formula is:

$$0.92(K_{0.48}Na_{0.52})_{0.96}Li_{0.04}Nb_{0.94}Sb_{0.06}O_3\text{-}0.01Bi_{0.5}K_{0.5}ZrO_3\text{-}0.07CaZrO_3;$$

when A=Ca, x=0.06, y=0.02, z=0, m=0.01, and n=0.08, a tenth formula is:

$$0.91(K_{0.48}Na_{0.52})_{0.96}Li_{0.04}Nb_{0.94}Sb_{0.06}O_3\text{-}0.01Bi_{0.5}K_{0.5}ZrO_3\text{-}0.08CaZrO_3;$$

when A=Ca, x=0.06, y=0.02, z=0, m=0.01, and n=0.1, an eleventh formula is:

$$0.89(K_{0.48}Na_{0.52})_{0.96}Li_{0.04}Nb_{0.94}Sb_{0.06}O_3\text{-}0.01Bi_{0.5}K_{0.5}ZrO_3\text{-}0.1CaZrO_3;$$

when A=Ca, x=0.06, y=0.02, z=0, m=0.01, and n=0.15, a twelfth formula is:

$$0.84(K_{0.48}Na_{0.52})_{0.96}Li_{0.04}Nb_{0.94}Sb_{0.06}O_3\text{-}0.01Bi_{0.5}K_{0.5}ZrO_3\text{-}0.15\ CaZrO_3;$$

for the group of embodiments, the preparation of the first to twelfth formulae includes the step of: accurately weighing analytically pure sodium carbonate, potassium carbonate, lithium carbonate, niobium pentoxide, antimony trioxide, bismuth oxide, zirconia and calcium carbonate serving as raw materials by weight percentage; the follow-up experimental process is the same as that of the embodiments of the group A.

Figure 6:
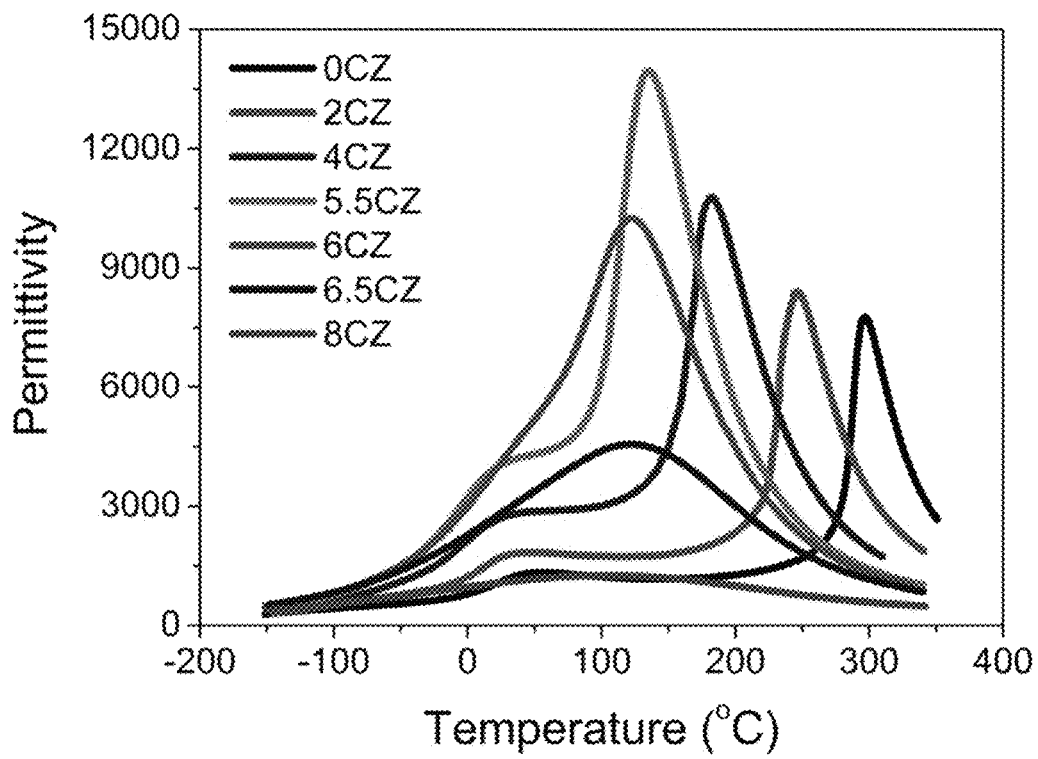
FIG. 6 shows the variation of relative permittivity $\varepsilon_r$ of a lead-free piezoelectric ceramic with temperature at 10 kHz in one embodiment of the present disclosure.

When n=0, 0.02, 0.04, 0.055, 0.06, 0.065 and 0.08 which are variable values, and A=Ca, x=0.06, y=0.02, z=0, and m=0.01 which are fixed values during preparation in the group of embodiments:

the change curve of the relative permittivity $\varepsilon_r$ of (0.99-n)$(K_{0.48}Na_{0.52})_{0.96}Li_{0.04}Nb_{0.94}\ Sb_{0.06}O_3$-$0.01Bi_{0.5}K_{0.5}ZrO_3$-$nCaZrO_3$ lead-free piezoelectric ceramics with temperature at 10 kHz is shown in FIG. 6. It can be seen that the permittivity at $T_C$ increases gradually after doping $CaZrO_3$. However, when the content n of $CaZrO_3$ is larger than 0.06, the permittivity at $T_C$ decreases rapidly, which indicates that the system has entered the relaxor ferroelectric region and thus loses its ferroelectricity rapidly.

Figure 11:
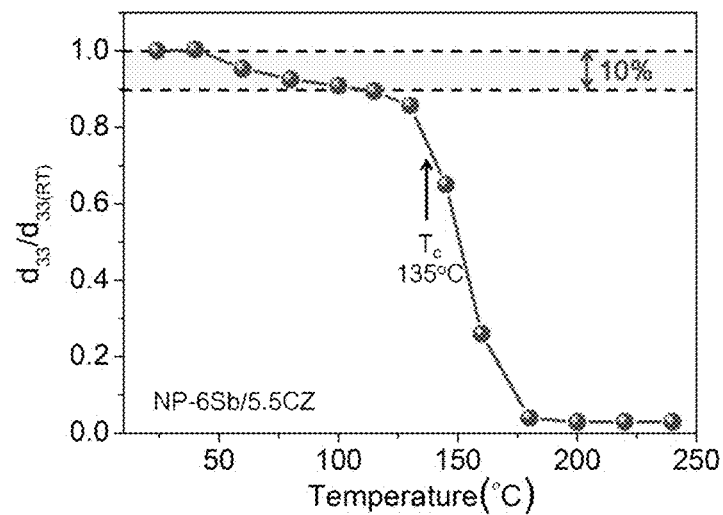
FIG. 11 shows the thermal stability of a lead-free piezoelectric ceramic in an embodiment of the present disclosure.

When n=0.05 and 0.055 which are variable values, and A=Ca, x=0.06, y=0.02, z=0, and m=0.01 which are fixed values during preparation in the group of embodiments: the temperature cycling stability schematic diagram of (0.99-n)$(K_{0.48}Na_{0.52})_{0.96}Li_{0.04}Nb_{0.94}Sb_{0.06}O_3$-$0.01Bi_{0.5}K_{0.5}ZrO_3$-$nCaZrO_3$ lead-free piezoelectric ceramics is shown in FIG. 11. It can be seen that after 1000 cycles between −55° C. and 80° C., the ceramic loses only 10% of its properties, thus being comparable to that of commercial PZT-5H.

When n=0.055, A=Ca, x=0.06, y=0.02, z=0, and m=0.01 during preparation in the group of embodiments:

the thermal stability schematic diagram of (0.99-n)$(K_{0.48}Na_{0.52})_{0.96}Li_{0.04}Nb_{0.94}Sb_{0.06}O_3$-$0.01Bi_{0.5}K_{0.5}ZrO_3$-$nCaZrO_3$ lead-free piezoelectric ceramics is shown in FIG. 12. It can be seen that 90% of the properties of the ceramics are maintained in the range of from the room temperature to 120° C., showing excellent thermal stability.

The first to tenth formulae of the group of embodiments are sintered at different temperatures, and polarized in silicone oil with different heat preservation time and temperatures, and the electrical properties of the obtained lead-free piezoelectric ceramics tested by the IEEE standard are shown in Table 4.

TABLE 4

Related properties of lead-free piezoelectric ceramics from the first to twelfth formulae at room temperature (wherein, "/" indicates no data)

| n (A = Ca) | $d_{33}$ (pC/N) | $k_p$ | $\varepsilon_r$ (10 kHz) | tan δ | $T_C$ (° C.) |
|---|---|---|---|---|---|
| 0.02 | 390 | −0.56 | 1966 | 0.032 | 244 |
| 0.03 | 460 | 0.56 | 2096 | 0.038 | 215 |
| 0.04 | 500 | 0.52 | 2752 | 0.046 | 183 |
| 0.045 | 560 | 0.54 | 3250 | 0.042 | 173 |
| 0.05 | 630 | 0.63 | 4080 | 0.032 | 155 |
| 0.055 | 670 | 0.61 | 4620 | 0.032 | 135 |
| 0.06 | 352 | 0.38 | 4880 | / | 117 |
| 0.065 | 55 | 0.22 | 3192 | / | 117 |
| 0.07 | 25 | / | 2017 | / | 112 |
| 0.08 | / | / | 1158 | / | 100 |
| 0.1 | / | / | 1638 | / | 80 |
| 0.15 | / | / | 835 | / | 14 |

Embodiments of a Group C

Proportioning is carried out according to the lithium sodium potassium niobate based ternary lead-free piezoelectric ceramic content represented by the general formula:

$$(1\text{-}m\text{-}n)[(K_{0.5\text{-}y}Na_{0.5+y})_{0.96}Li_{0.04}Nb_{1\text{-}x}Sb_xO_3]\text{-}m[(Bi_{0.5}(Na_zK_{1\text{-}z})_{0.5}ZrO_3]\text{-}nAZrO_3;$$

when A=Sr, x=0.06, y=0.02, z=1, m=0.01, and n=0.00, a first formula is:

$$0.99(K_{0.48}Na_{0.52})_{0.96}Li_{0.04}Nb_{0.94}Sb_{0.06}O_3\text{-}0.01Bi_{0.5}Na_{0.5}ZrO_3;$$

When A=Sr, x=0.06, y=0.02, z=1, m=0.01, and n=0.02, a second formula is:

$$0.97(K_{0.48}Na_{0.52})_{0.96}Li_{0.04}Nb_{0.94}\ Sb_{0.06}O_3\text{-}0.01Bi_{0.5}Na_{0.5}ZrO_3\text{-}0.02SrZrO_3;$$

when A=Sr, x=0.06, y=0.02, z=1, m=0.01, and n=0.03, a third formula is:

$$0.96(K_{0.48}Na_{0.52})_{0.96}Li_{0.04}Nb_{0.94}Sb_{0.06}O_3\text{-}0.01Bi_{0.5}Na_{0.5}ZrO_3\text{-}0.03SrZrO_3;$$

when A=Sr, x=0.06, y=0.02, z=1, m=0.01, and n=0.04, a fourth formula is:

$$0.95(K_{0.48}Na_{0.52})_{0.96}Li_{0.04}Nb_{0.94}\ Sb_{0.06}O_3\text{-}0.01Bi_{0.5}Na_{0.5}ZrO_3\text{-}0.04SrZrO_3;$$

when A=Sr, x=0.06, y=0.02, z=1, m=0.01, and n=0.045, a fifth formula is:

$$0.945(K_{0.48}Na_{0.52})_{0.96}Li_{0.04}Nb_{0.94}\ Sb_{0.06}O_3\text{-}0.01Bi_{0.5}Na_{0.5}ZrO_3\text{-}0.045SrZrO_3;$$

when A=Sr, x=0.06, y=0.02, z=1, m=0.01, and n=0.05, a sixth formula is:

$$0.94(K_{0.48}Na_{0.52})_{0.96}Li_{0.04}Nb_{0.94}\ Sb_{0.06}O_3\text{-}0.01Bi_{0.5}Na_{0.5}ZrO_3\text{-}0.05SrZrO_3;$$

when A=Sr, x=0.06, y=0.02, z=1, m=0.01, and n=0.055, a seventh formula is as follows:

$$0.935(K_{0.48}Na_{0.52})_{0.96}Li_{0.04}Nb_{0.94}Sb_{0.06}O_3\text{-}0.01Bi_{0.5}Na_{0.5}ZrO_3\text{-}0.055SrZrO_3;$$

when A=Sr, x=0.06, y=0.02, z=1, m=0.01, and n=0.06, an eighth formula is:

$$0.93(K_{0.48}Na_{0.52})_{0.96}Li_{0.04}Nb_{0.94}Sb_{0.06}O_3\text{-}0.01Bi_{0.5}Na_{0.5}ZrO_3\text{-}0.06SrZrO_3;$$

when A=Sr, x=0.06, y=0.02, z=1, m=0.01, and n=0.065, a ninth formula is:

$$0.925(K_{0.48}Na_{0.52})_{0.96}Li_{0.04}Nb_{0.94}\ Sb_{0.06}O_3\text{-}0.01Bi_{0.5}Na_{0.5}ZrO_3\text{-}0.065SrZrO_3;$$

when A=Sr, x=0.06, y=0.02, z=1, m=0.01, and n=0.07, a tenth formula is:

$$0.92(K_{0.48}Na_{0.52})_{0.96}Li_{0.04}Nb_{0.94}Sb_{0.06}O_3\text{-}0.01Bi_{0.5}Na_{0.5}ZrO_3\text{-}0.07SrZrO_3;$$

when A=Sr, x=0.06, y=0.02, z=1, m=0.01, and n=0.08, an eleventh formula is:

$$0.91(K_{0.48}Na_{0.52})_{0.96}Li_{0.04}Nb_{0.94}Sb_{0.06}O_3\text{-}0.01Bi_{0.5}Na_{0.5}ZrO_3\text{-}0.08SrZrO_3;$$

when A=Sr, x=0.06, y=0.02, z=1, m=0.01, and n=0.1, a twelfth formula is:

$$0.89(K_{0.48}Na_{0.52})_{0.96}Li_{0.04}Nb_{0.94}Sb_{0.06}O_3\text{-}0.01Bi_{0.5}Na_{0.5}ZrO_3\text{-}0.1SrZrO_3;$$

when A=Sr, x=0.06, y=0.02, z=1, m=0.01, and n=0.15, a thirteenth formula is:

$$0.84(K_{0.48}Na_{0.52})_{0.96}Li_{0.04}Nb_{0.94}Sb_{0.06}O_3\text{-}0.01Bi_{0.5}Na_{0.5}ZrO_3\text{-}0.15SrZrO_3;$$

the preparation of the first to thirteenth formulae includes the step of: accurately weighing the analytically pure sodium carbonate, potassium carbonate, lithium carbonate, niobium pentoxide, antimony trioxide, bismuth oxide, zirconia and strontium carbonate serving as raw materials by weight percentage; the follow-up experimental process is the same as that of the embodiments of the group A.

Figure 7:
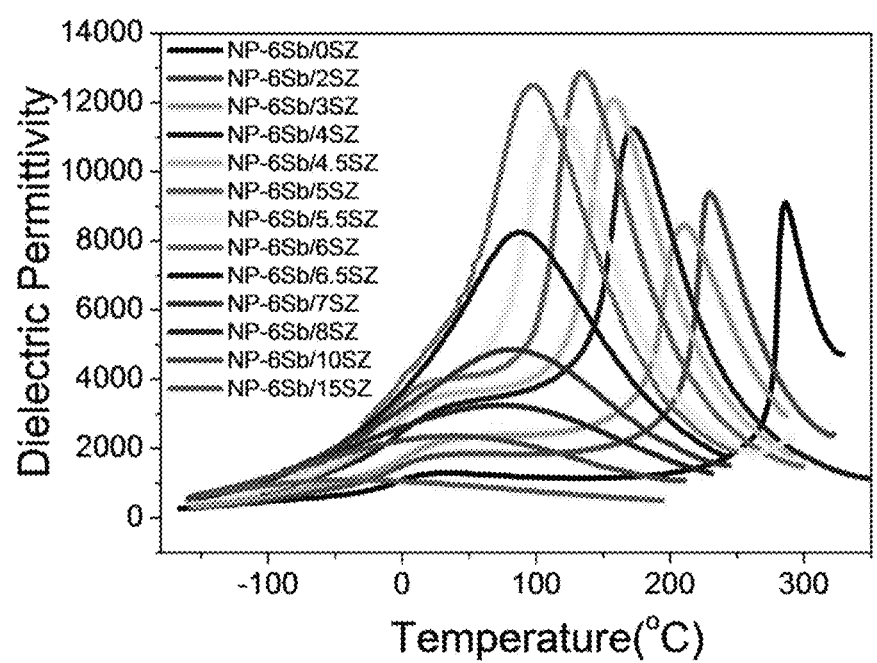
FIG. 7 shows the variation of relative permittivity $\varepsilon_r$ of a lead-free piezoelectric ceramic with temperature at 10 kHz in one embodiment of the present disclosure.

When n=0, 0.02, 0.03, 0.04, 0.045, 0.05, 0.055, 0.06, 0.065, 0.07, 0.08, 0.1, and 0.15 which are variable values and A=Sr, x=0.06, y=0.02, z=1, and m=0.01 which are fixed vales during preparation in the group of embodiments, the change curve of the relative permittivity $(0.99\text{-}n)(K_{0.48}Na_{0.52})_{0.96}Li_{0.04}Nb_{0.94}Sb_{0.06}O_3\text{-}0.01Bi_{0.5}Na_{0.5}ZrO_3\text{-}nSrZrO_3$ lead-free piezoelectric ceramics with temperature at 10 kHz is shown in FIG. 7. It can be seen that when the variable A is the element Sr and z=1, with the increase of the SrZrO3 content, the performance of its permittivity is similar to that of the previous embodiment in which the variable A is the element Ca and z=0.

The first to thirteenth formulae of this group of embodiments are sintered at different temperatures, and polarized in silicone oil with different heat preservation time and temperatures, and the electrical properties of the obtained lead-free piezoelectric ceramics tested by the IEEE standard are shown in Table 5.

TABLE 5

Related properties of lead-free piezoelectric ceramics from the first to thirteenth formulae at room temperature

| n (A = Sr) | $d_{33}$ (pC/N) | $k_p$ | $\varepsilon_r$ (10 kHz) | $T_C$ (° C.) |
|---|---|---|---|---|
| 0 | 350 | 0.51 | 1290 | 286 |
| 0.02 | 410 | 0.54 | 1796 | 230 |
| 0.03 | 460 | 0.59 | 2166 | 211 |
| 0.04 | 520 | 0.54 | 3107 | 172 |
| 0.045 | 558 | 0.56 | 3500 | 158 |
| 0.05 | 570 | 0.55 | 3965 | 134 |
| 0.055 | 540 | 0.51 | 3877 | 118 |
| 0.06 | 450 | 0.44 | 5200 | 97 |
| 0.065 | 335 | 0.34 | 4874 | 88 |
| 0.07 | 60 | 0.23 | 3827 | 82 |
| 0.08 | 50 | 0.18 | 2957 | 75 |
| 0.1 | 20 | 0.1 | 2350 | 40 |
| 0.15 | 10 | / | 1000 | −38 |

Embodiments of a Group D

Proportioning is carried out according to the lithium sodium potassium niobate based ternary lead-free piezoelectric ceramic content represented by the general formula:

$$(1\text{-}m\text{-}n)[(K_{0.5-y}Na_{0.5+y})_{0.96}Li_{0.04}Nb_{1-x}Sb_xO_3]\text{-}m[(Bi_{0.5}(Na_zK_{1-z})_{0.5}ZrO_3]\text{-}nAZrO_3;$$

when A=Ba, x=0.06, y=0.02, z=1, m=0.01, and n=0.02, a first formula is:

$$0.97(K_{0.48}Na_{0.52})_{0.96}Li_{0.04}Nb_{0.94}Sb_{0.06}O_3\text{-}0.01Bi_{0.5}Na_{0.5}ZrO_3\text{-}0.02BaZrO_3;$$

when A=Ba, x=0.06, y=0.02, z=1, m=0.01, and n=0.03, a second formula is:

$$0.96(K_{0.48}Na_{0.52})_{0.96}Li_{0.04}Nb_{0.94}Sb_{0.06}O_3\text{-}0.01Bi_{0.5}Na_{0.5}ZrO_3\text{-}0.03BaZrO_3;$$

when A=Ba, x=0.06, y=0.02, z=1, m=0.01, and n=0.04, a third formula is:

$$0.95(K_{0.48}Na_{0.52})_{0.96}Li_{0.04}Nb_{0.94}Sb_{0.06}O_3\text{-}0.01Bi_{0.5}Na_{0.5}ZrO_3\text{-}0.04BaZrO_3;$$

when A=Ba, x=0.06, y=0.02, z=1, m=0.01, and n=0.045, a fourth formula is:

$$0.945(K_{0.48}Na_{0.52})_{0.96}Li_{0.04}Nb_{0.94}Sb_{0.06}O_3\text{-}0.01Bi_{0.5}Na_{0.5}ZrO_3\text{-}0.045BaZrO_3;$$

when A=Ba, x=0.06, y=0.02, z=1, m=0.01, and n=0.05, a fifth formula is:

$$0.94(K_{0.48}Na_{0.52})_{0.96}Li_{0.04}Nb_{0.94}Sb_{0.06}O_3\text{-}0.01Bi_{0.5}Na_{0.5}ZrO_3\text{-}0.05BaZrO_3;$$

when A=Ba, x=0.06, y=0.02, z=1, m=0.01, and n=0.055, a sixth formula is:

$$0.935\,(K_{0.48}Na_{0.52})_{0.96}Li_{0.04}Nb_{0.94}Sb_{0.06}O_3\text{-}0.01Bi_{0.5}Na_{0.5}ZrO_3\text{-}0.055BaZrO_3;$$

when A=Ba, x=0.06, y=0.02, z=1, m=0.01, and n=0.06, a seventh formula is:

$$0.93(K_{0.48}Na_{0.52})_{0.96}Li_{0.04}Nb_{0.94}Sb_{0.06}O_3\text{-}0.01Bi_{0.5}Na_{0.5}ZrO_3\text{-}0.06BaZrO_3;$$

when A=Ba, x=0.06, y=0.02, z=1, m=0.01, and n=0.065, an eighth formula is:

$$0.925(K_{0.48}Na_{0.52})_{0.96}Li_{0.04}Nb_{0.94}Sb_{0.06}O_3\text{-}0.01Bi_{0.5}Na_{0.5}ZrO_3\text{-}0.065BaZrO_3;$$

when A=Ba, x=0.06, y=0.02, z=1, m=0.01, and n=0.07, a ninth formula is:

$$0.92(K_{0.48}Na_{0.52})_{0.96}Li_{0.04}Nb_{0.94}Sb_{0.06}O_3\text{-}0.01Bi_{0.5}Na_{0.5}ZrO_3\text{-}0.07BaZrO_3;$$

when A=Ba, x=0.06, y=0.02, z=1, m=0.01, and n=0.08, a tenth formula is:

$$0.91(K_{0.48}Na_{0.52})_{0.96}Li_{0.04}Nb_{0.94}Sb_{0.06}O_3\text{-}0.01Bi_{0.5}Na_{0.5}ZrO_3\text{-}0.08BaZrO_3;$$

when A=Ba, x=0.06, y=0.02, z=1, m=0.01, and n=0.1, an eleventh formula is:

$$0.89(K_{0.48}Na_{0.52})_{0.96}Li_{0.04}Nb_{0.94}Sb_{0.06}O_3\text{-}0.01Bi_{0.5}Na_{0.5}ZrO_3\text{-}0.1BaZrO_3;$$

when A=Ba, x=0.06, y=0.02, z=1, m=0.01, and n=0.12, a twelfth formula is:

$$0.84(K_{0.48}Na_{0.52})_{0.96}Li_{0.04}Nb_{0.94}Sb_{0.06}O_3\text{-}0.01Bi_{0.5}Na_{0.5}ZrO_3\text{-}0.12BaZrO_3;$$

the preparation of the first to twelfth formulae includes the step of: accurately weighing analytically pure sodium carbonate, potassium carbonate, lithium carbonate, niobium pentoxide, antimony trioxide, bismuth oxide, zirconia and barium carbonate serving as raw materials by weight percentage; the follow-up experimental process is the same as that of the embodiments of the group A.

Figure 8:
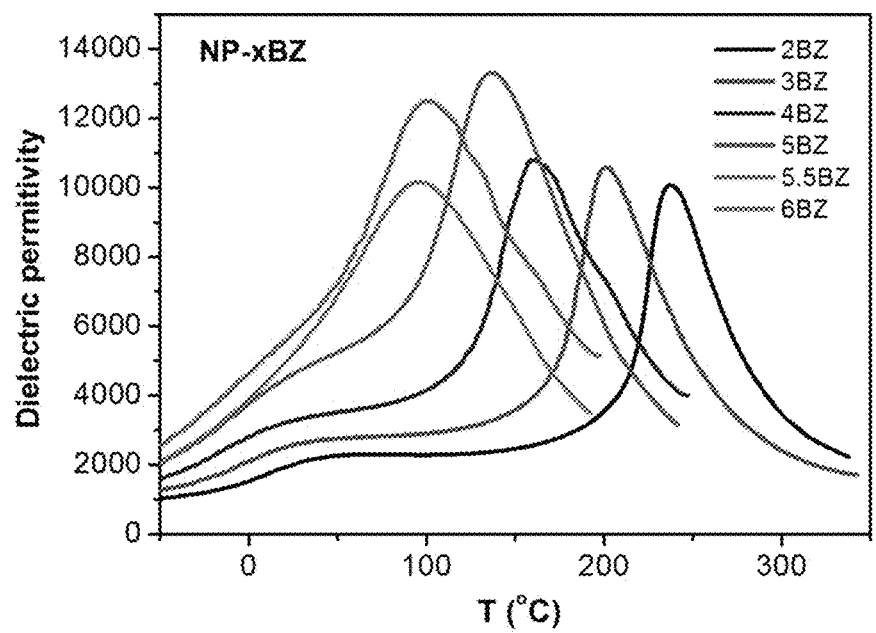
FIG. 8 shows the variation of relative permittivity $\varepsilon_r$ of a lead-free piezoelectric ceramic with temperature at 10 kHz in one embodiment of the present disclosure.

When n=0.02, 0.03, 0.04, 0.05, 0.055, and 0.06 which are variable values, and A=Ba, x=0.06, y=0.02, z=1, and m=0.01 which are fixed values during preparation in the group of embodiments:

the change curve of the relative permittivity $\varepsilon_r$ of $(0.99-n)(K_{0.48}Na_{0.52})_{0.96}Li_{0.04}Nb_{0.94}Sb_{0.06}O_3$-$0.01Bi_{0.5}Na_{0.5}ZrO_3$-$nBaZrO_3$ lead-free piezoelectric ceramics with temperature at 10 kHz is shown in FIG. 8. It can be seen that the variable A is the element Ba and z=0, and the result is similar to those in FIG. 6-7. Therefore, this fully demonstrates that the method disclosed in the present disclosure is universal in potassium sodium niobate based lead-free piezoelectric ceramics.

The above formulae of the embodiments of the group are sintered at different temperatures, and polarized in silicone oil with different heat preservation time and temperatures, and the electrical properties of the obtained lead-free piezoelectric ceramics tested by IEEE standard are shown in Table 6.

TABLE 6

Related properties of lead-free piezoelectric ceramics with the above formulae at room temperature

| n (A = Ba) | $d_{33}$ (pC/N) | $k_p$ | $\varepsilon_r$ (10 kHz) | $T_C$ (° C.) |
|---|---|---|---|---|
| 0.02 | 320 | 0.51 | 2020 | 242 |
| 0.03 | 420 | 0.52 | 2560 | 205 |
| 0.04 | 500 | 0.57 | 3300 | 175 |
| 0.045 | 503 | 0.54 | 3723 | 153 |
| 0.05 | 504 | 0.51 | 4620 | 136 |
| 0.055 | 481 | 0.44 | 5150 | 117 |
| 0.06 | 412 | 0.40 | 5850 | 99 |
| 0.07 | 36 | 0.21 | 5050 | 80 |
| 0.08 | 18 | 0.18 | 4213 | 67 |
| 0.1 | / | / | 3659 | 25 |
| 0.12 | / | / | 2662 | −5 |

Embodiments of a Group E

Proportioning is carried out according to the barium titanate based ternary lead-free piezoelectric ceramic content represented by the general formula

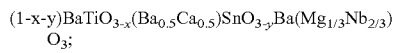

$O_3$;

when x=0, and y=0,
a first formula is: $BaTiO_3$;
when x=0.03, and y=0,
a second formula is: $0.97BaTiO_3$-$0.03(Ba_{0.5}Ca_{0.5})SnO_3$;
when x=0.06, and y=0,
a third formula is: $0.94BaTiO_3$-$0.06(Ba_{0.5}Ca_{0.5})SnO_3$;
when x=0.09, and y=0,
a fourth formula is: $0.91BaTiO_3$-$0.09(Ba_{0.5}Ca_{0.5})SnO_3$;
when x=0.11, and y=0,
a fifth formula is: $0.89BaTiO_3$-$0.11(Ba_{0.5}Ca_{0.5})SnO_3$;
when x=0.12, and y=0,
a sixth formula is: $0.88BaTiO_3$-$0.12(Ba_{0.5}Ca_{0.5})SnO_3$;
when x=0.16, and y=0,
a seventh formula is: $0.84BaTiO_3$-$0.16(Ba_{0.5}Ca_{0.5})SnO_3$;
when x=0.20, and y=0,
an eighth formula is: $0.8BaTiO_3$-$0.2(Ba_{0.5}Ca_{0.5})SnO_3$;

the preparation of the first to eighth formulae includes the step of: accurately weighing the analytically pure barium carbonate, calcium carbonate, titanium dioxide and tin dioxide serving as raw materials by weight percentage; the follow-up experimental process is the same as that of the embodiments of group A.

Figure 9:
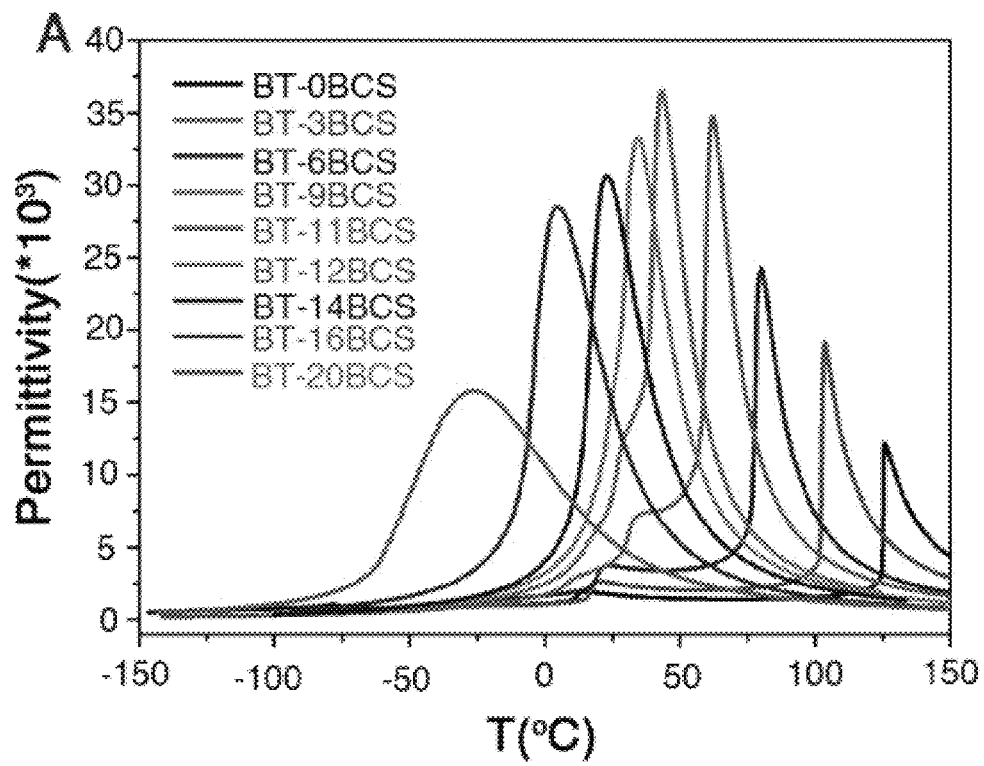
FIG. 9 shows the variation of relative permittivity $\varepsilon_r$ of a lead-free piezoelectric ceramic with temperature at 10 kHz in one embodiment of the present disclosure.

When x=0, 0.03, 0.06, 0.09, 0.11, 0.12, 0.14, 0.16, and 0.2 which are variable values, and y=0 which is a fixed value during preparation in the group of embodiments, the change curve of the relative permittivity $\varepsilon_r$ of $(1-x)BaTiO_{3-x}(Ba_{0.5}Ca_{0.5})SnO_3$ lead-free piezoelectric ceramics with temperature at 10 kHz is shown in FIG. 9. It can be seen that when $BaTiO_3$ is doped with $(Ba_{0.5}Ca_{0.5})SnO_3$, the permittivity at $T_C$ increases with the increase of the content x of $(Ba_{0.5}Ca_{0.5})SnO_3$, and reaches the maximum value at the four-phase point composition; after that, the permittivity at $T_C$ gradually decreases with the further increase of x. This trend is also consistent with the change trend of the piezoelectric constant with composition in FIG. 4B.

The first to eighth formulae of the embodiments of the group are sintered at different temperatures, and polarized in silicone oil with different heat preservation time and temperatures, and the electrical properties of the obtained lead-free piezoelectric ceramics tested by the IEEE standard are shown in Table 7.

TABLE 7

Related properties of lead-free piezoelectric ceramics from the first to eighth formulae at variable temperature conditions

| x | $d_{33}$ maximum value (pC/N) | $d_{33}$ maximum value obtaining temperature | Phase boundary corresponding to $d_{33}$ maximum value | $T_C$ (° C.) |
|---|---|---|---|---|
| 0 | 288 | 10 | T/O | 125 |
| 0.03 | 366 | 16 | T/O | 104 |
| 0.06 | 558 | 33 | T/O | 80 |
| 0.09 | 892 | 37 | T/O | 62 |
| 0.11 | 1120 | 36 | T/O | 43 |
| 0.12 | 827 | 32 | MCP | 33 |
| 0.16 | 182 | −6 | C/R | 5 |
| 0.20 | 167 | −53 | C/R | −26 |

Embodiments of a Group F

Proportioning is carried out according to the barium titanate based ternary lead-free piezoelectric ceramic content represented by the general formula

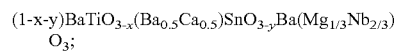

$O_3$;

when x=0, and y=0.02,
a first formula is: $0.98BaTiO_3$-$0.02Ba(Mg_{1/3}Nb_{2/3})O_3$;
when x=0, and y=0.03,
a second formula is: $0.97BaTiO_3$-$0.03Ba(Mg_{1/3}Nb_{2/3})O_3$;
when x=0, and y=0.04,
a third formula is: $0.96BaTiO_3$-$0.04Ba(Mg_{1/3}Nb_{2/3})O_3$;
when x=0, and y=0.05,
a fourth formula is: $0.95BaTiO_3$-$0.05Ba(Mg_{1/3}Nb_{2/3})O_3$;
when x=0, and y=0.06,
a fifth formula is: $0.94BaTiO_3$-$0.06Ba(Mg_{1/3}Nb_{2/3})O_3$;
when x=0, and y=0.07,
a sixth formula is: $0.93BaTiO_3$-$0.07Ba(Mg_{1/3}Nb_{2/3})O_3$;
when x=0, and y=0.08,
a seventh formula is: $0.92BaTiO_3$-$0.08Ba(Mg_{1/3}Nb_{2/3})O_3$;

the preparation of the first to seventh formulae includes the step of: accurately weighing the analytically pure barium carbonate, magnesium oxide, titanium dioxide and niobium pentoxide serving as raw materials by weight percentage; the follow-up experimental process is the same as that of the embodiments of group A.

Figure 10:
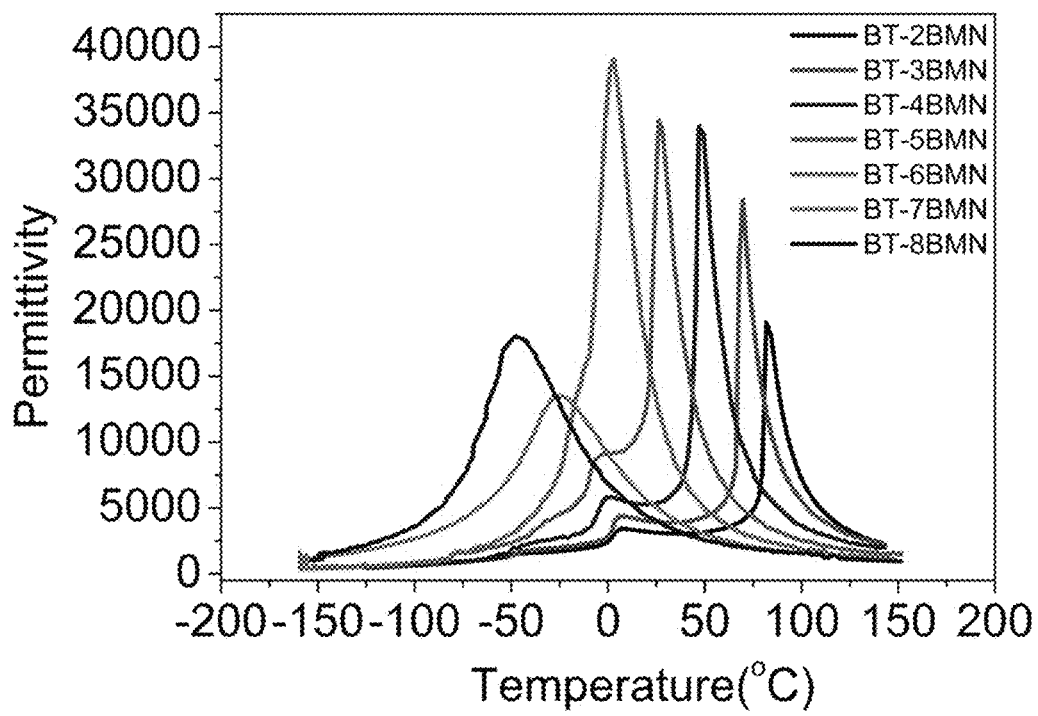
FIG. 10 shows the variation of relative permittivity $\varepsilon_r$ of a lead-free piezoelectric ceramic with temperature at 10 kHz in one embodiment of the present disclosure.

When y=0.02, 0.03, 0.04, 0.05, 0.06, 0.07, and 0.08 which are variable values, and x=0 which is a fixed value during preparation in the group of embodiments, the change curve of the relative permittivity $\varepsilon_r$ of $(1-y)BaTiO_3-yBa(Mg_{1/3}Nb_{2/3})O_3$ lead-free piezoelectric ceramics with temperature at 10 kHz is shown in FIG. 10. It can be seen that when $BaTiO_3$ is doped with $Ba(Mg_{1/3}Nb_{2/3})O_3$, the permittivity at $T_C$ increases with the increase of the content y of $Ba(Mg_{1/3}Nb_{2/3})O_3$, and then decreases rapidly as the system enters the relaxor ferroelectric region. Therefore, the maximum permittivity at $T_C$ appears near the boundary composition of ferroelectrics/relaxor ferroelectrics.

The first to seventh formulae of the embodiments of the group are sintered at different temperatures, and polarized in silicone oil with different heat preservation time and temperatures, and the electrical properties of the obtained lead-free piezoelectric ceramics tested by the IEEE standard are shown in Table 8.

TABLE 8

Related properties of lead-free piezoelectric ceramics from the first to seventh formulae under variable temperature conditions

| x | $d_{33}$ maximum value (pC/N) | $d_{33}$ maximum value obtaining temperature (° C.) | Phase boundary corresponding to $d_{33}$ maximum value | $T_C$ (° C.) |
|---|---|---|---|---|
| 0.02 | 177 | 12 | T/O | 83 |
| 0.03 | 258 | 12 | T/O | 69 |
| 0.04 | 293 | 0 | T/O | 48 |
| 0.05 | 333 | 0 | T/O | 26 |
| 0.06 | 492 | −8 | T/O | 4 |
| 0.07 | 77 | −18 | C/R | −25 |
| 0.08 | 47 | −46 | C/R | −48 |

The above formulae and their embodiments illustrate once again that the present disclosure provides a method for obtaining lead-free piezoelectric ceramics with high piezoelectric constant and high Curie temperature. It can be seen from the results listed in the table above that its piezoelectric constant is the highest piezoelectric constant of lead-free piezoelectric ceramics so far, and the lead-free piezoelectric ceramics are comparable to PZT series in performance.

In addition, it is also indicated that according to the general chemical formula:

$$(1-m-n)[(K_{0.5-y}Na_{0.5+y})_{0.96}Li_{0.04}Nb_{1-x}Sb_xO_3]-m[(Bi_{0.5}(Na_zK_{1-z})_{0.5}ZrO_3]-nAZrO_3,$$

when A=Ca, x=0.06, y=0.02, z=0, m=0.01, and n=0.05, the piezoelectric constant $d_{33}$ of the obtained lithium sodium potassium niobate based ternary lead-free piezoelectric ceramic can be as high as about 630 pC/N, the planar electromechanical coupling coefficient $k_p$ can reach 63%, and the Curie temperature $T_C$ can reach 155° C., so that the lithium sodium potassium niobate based ternary lead-free piezoelectric ceramic can completely replace the commercial soft PZT ceramics. The range of $d_{33}$ of the PZT ceramic series can reach 190-670 pC/N, and the range of $T_C$ can reach 410° C.-130° C. The lithium sodium potassium niobate based ternary lead-free piezoelectric ceramic can meet the application of piezoelectric ceramics in various complex conditions (such as high temperature, high frequency, etc), and therefore has a very high practical value.

When x is 0.11 and y is 0, another kind of barium titanate based ternary lead-free piezoelectric ceramics can be obtained in the above embodiment, and the series of ceramics have the highest piezoelectric constant up to now under variable temperature conditions:

when the formula $0.89BaTiO_3-0.11(Ba_{0.5}Ca_{0.5})SnO_3$ is adopted and Curie temperature is 36° C., $d_{33}=1120$ pC/N. In this case, the ceramics can be used in some occasions having extremely high requirement on the piezoelectric properties, but almost no requirement on the Curie temperature.

According to the contents disclosed in the description, for the general formula $(1-x-y)BaTiO_3-x(Ba_{0.5}Ca_{0.5})SnO_3-yBa(Mg_{1/3}Nb_{2/3})O_3$, see the above embodiments of the group E and group F for details. As long as x and y satisfy that $0 \leq x \leq 0.2$, and $0 \leq y \leq 0.1$, corresponding lead-free piezoelectric materials conforming to the purpose of the disclosure can be obtained.

In another embodiment, the general formula for the composition of the second lead-free piezoelectric material is as follows:

$$(1-m-n)[(K_{0.5-y}Na_{0.5+y})_{0.96}Li_{0.04}Nb_{1-x}Sb_xO_3]-m[(Bi_{0.5}(Na_zK_{1-z})_{0.5}ZrO_3]-nAZrO_3,$$

wherein $0 \leq m \leq 0.02$, $0 \leq n \leq 0.1$, $0 \leq x \leq 0.07$, $0 \leq y \leq 0.1$, z=0, 1, and A represents one or a combination of the following divalent metal ions: Ca, Mg and Ba.

Furthermore, the piezoelectric constant $d_{33}$ is in the range of 190 pC/N-670 pC/N.

Furthermore, the Curie temperature $T_C$ is in the range of 130° C.-410° C.

Furthermore, when the Curie temperature $T_C$ is in the range of 290° C.-410° C., the temperature difference between the C/T phase boundary and the T/O phase boundary is between 270° C. and 350° C., and the $d_{33}$ is in the range of 190 pC/N-330 pC/N.

In addition, in another embodiment, the composition of the second lead-free piezoelectric material is one of the following:

$0.99(K_{0.48}Na_{0.52})_{0.96}Li_{0.04}NbO_3-0.01Bi_{0.5}K_{0.5}ZrO_3$, or
$0.99(K_{0.48}Na_{0.52})_{0.96}Li_{0.04}Nb_{0.97}Sb_{0.03}O_3-0.01Bi_{0.5}K_{0.5}ZrO_3$, or
$0.99(K_{0.48}Na_{0.52})_{0.96}Li_{0.04}Nb_{0.94}Sb_{0.06}O_3-0.01Bi_{0.5}K_{0.5}ZrO_3$.

Furthermore, when $T_C$ is in the range of 200° C.-290° C., the temperature difference between the C/T phase boundary and the T/O phase boundary is between 180° C. and 270° C., and the $d_{33}$ is in the range of 310 pC/N-460 pC/N.

In addition, in another embodiment, the composition of the second lead-free piezoelectric material is one of the following:

$0.97(K_{0.48}Na_{0.52})_{0.96}Li_{0.04}Nb_{0.94}Sb_{0.06}O_3-0.01Bi_{0.5}K_{0.5}ZrO_3-0.02CaZrO_3$, or
$0.96(K_{0.48}Na_{0.52})_{0.96}Li_{0.04}Nb_{0.94}Sb_{0.06}O_3-0.01Bi_{0.5}K_{0.5}ZrO_3-0.03CaZrO_3$.

Furthermore, when $T_C$ is in the range of 130° C.-200° C., the temperature difference between the C/T phase boundary and the T/O phase boundary is between 110° C. and 180° C., and the $d_{33}$ is in the range of 460 pC/N-670 pC/N.

In addition, in another embodiment, the composition of the second lead-free piezoelectric material is one of the following:

$0.95(K_{0.48}Na_{0.52})_{0.96}Li_{0.04}Nb_{0.94}Sb_{0.06}O_3-0.01Bi_{0.5}K_{0.5}ZrO_3-0.04CaZrO_3$, or 0.94($K_{0.48}Na_{0.52}$)$_{0.96}Li_{0.04}Nb_{0.94}Sb_{0.06}O_3$-
0.01$Bi_{0.5}K_{0.5}ZrO_3$-0.05$CaZrO_3$, or
0.935($K_{0.48}Na_{0.52}$)$_{0.96}Li_{0.04}Nb_{0.94}$ $Sb_{0.06}O_3$-0.01$Bi_{0.51}$
(0.5$ZrO_3$-0.055$CaZrO_3$.

In another embodiment, as mentioned above, the second lead-free piezoelectric material includes a barium titanate based ternary lead-free piezoelectric ceramic.

Furthermore, the general formula for the composition of the second lead-free piezoelectric material is as follows:
(1-x-y)$BaTiO_3$-x($Ba_{0.5}Ca_{0.5}$)$SnO_{3-y}Ba(Mg_{1/3}Nb_{2/3})O_3$,
wherein, in the formula, $0 \le x \le 0.2$, and $0 \le y \le 0.1$.

Furthermore, the piezoelectric constant $d_{33}$ is in the range of 300 pC/N-1120 pC/N.

Furthermore, the Curie temperature $T_C$ is in the range of 0° C.-100° C.

Furthermore, the composition of the second lead-free piezoelectric material is as follows: 0.89$BaTiO_3$-0.11($Ba_{0.5}Ca_{0.5}$)$SnO_3$; as mentioned above, for the barium titanate based ternary lead-free piezoelectric ceramic 0.89$BaTiO_3$-0.11($Ba_{0.5}Ca_{0.5}$)$SnO_3$, under the variable temperature conditions, the series of ceramics have the highest piezoelectric constant up to now: $d_{33}$=1120 pC/N. In this case, the ceramics can be used in some occasions having extremely high requirement on the piezoelectric properties, but almost no requirement on the Curie temperature.

According to the contents disclosed in the description, for the general formula (1-x-y)$BaTiO_{3-x}$($Ba_{0.5}Ca_{0.5}$)$SnO_{3-y}Ba$($Mg_{1/3}Nb_{2/3}$)$O_3$, as long as x and y satisfy $0 \le x \le 0.2$, and $0 \le y \le 0.1$, the corresponding lead-free piezoelectric materials conforming to the purpose of the present disclosure can be obtained.

In addition, according to the method described above, the present disclosure also discloses a lead-free piezoelectric material, wherein:
the T/O phase boundary between the tetragonal phase T and the orthorhombic phase O of the lead-free piezoelectric material is located near the room temperature;
the C/T phase boundary between the cubic paraelectric phase C and the tetragonal phase T and the O/R phase boundary between the orthorhombic phase O and the rhombohedral phase R of the lead-free piezoelectric material are both in a state approaching the T/O phase boundary; wherein
different degrees of phase boundary approaching are related to different piezoelectric constants $d_{33}$ and different Curie temperatures $T_C$ of the lead-free piezoelectric material.

As mentioned above, lead-free piezoelectric materials with different properties can be obtained by phase boundary approaching.

More preferably, the approaching includes the following situations:
the C/T phase boundary, the O/R phase boundary and the T/O phase boundary tend to converge to one point.
More preferably, the lead-free piezoelectric material includes:
a lead-free piezoelectric ceramic with a perovskite crystal type.
More preferably, the lead-free piezoelectric material includes:
a lithium sodium potassium niobate based ternary lead-free piezoelectric ceramic.
More preferably, near room temperature is about 20° C.-30° C. More preferably, in a wider temperature range, near room temperature is about 10° C.-40° C. Understandably, the purpose of this setting is to obtain lead-free piezoelectric materials capable of being applied near the room temperature.

In another embodiment, the general formula for the composition of the lead-free piezoelectric material is as follows:

(1-m-n)[($K_{0.5-y}Na_{0.5+y}$)$_{0.96}Li_{0.04}Nb_{1-x}Sb_xO_3$]-m
[($Bi_{0.5}(Na_zK_{1-z})_{0.5}ZrO_3$]-n$AZrO_3$, wherein $0 \le m \le 0.02$, $0 \le n \le 0.1$, $0 \le x \le 0.07$, $0 \le y \le 0.1$, z=0, 1, and A is selected from one or a combination of the following divalent metal ions: Ca, Mg and Ba.

In another embodiment, the piezoelectric constant $d_{33}$ is in the range of 190 pC/N-670 pC/N.

In another embodiment, the Curie temperature $T_C$ is in the range of 130° C.-410° C.

In another embodiment, when the Curie temperature $T_C$ is in the range of 290° C.-410° C., the temperature difference between the C/T phase boundary and the T/O phase boundary is between 270° C. and 350° C., and the $d_{33}$ is in the range of 190 pC/N-330 pC/N.

In another embodiment, the composition of the lead-free piezoelectric material is one of the following:
0.99($K_{0.48}Na_{0.52}$)$_{0.96}Li_{0.04}NbO_3$-0.01$Bi_{0.5}K_{0.5}ZrO_3$, or
0.99($K_{0.48}Na_{0.52}$)$_{0.96}Li_{0.04}Nb_{0.97}Sb_{0.03}O_3$-
0.01$Bi_{0.5}K_{0.5}ZrO_3$, or
0.99($K_{0.48}Na_{0.52}$)$_{0.96}Li_{0.04}Nb_{0.94}Sb_{0.06}O_3$-
0.01$Bi_{0.5}K_{0.5}ZrO_3$.

In another embodiment, when the $T_C$ is in the range of 200° C.-290° C., the temperature difference between the C/T phase boundary and the T/O phase boundary is between 180° C. and 270° C., and the $d_{33}$ is in the range of 310 pC/N-460 pC/N.

In another embodiment, the composition of the lead-free piezoelectric material is one of the following:
0.97($K_{0.48}Na_{0.52}$)$_{0.96}Li_{0.04}Nb_{0.94}Sb_{0.06}O_3$-
0.01$Bi_{0.5}K_{0.5}ZrO_3$-0.02$CaZrO_3$, or
0.96($K_{0.48}Na_{0.52}$)$_{0.96}Li_{0.04}Nb_{0.94}Sb_{0.06}O_3$-
0.01$Bi_{0.5}K_{0.5}ZrO_3$-0.03$CaZrO_3$.

In another embodiment, when the $T_C$ is in the range of 130° C.-200° C., the temperature difference between the C/T phase boundary and the T/O phase boundary is between 110° C.-180° C., and the $d_{33}$ is in the range of 460 pC/N-670 pC/N.

In another embodiment, the composition of the lead-free piezoelectric material is one of the following:
0.95($K_{0.48}Na_{0.52}$)$_{0.96}Li_{0.04}Nb_{0.94}Sb_{0.06}O_3$-
0.01$Bi_{0.5}K_{0.5}ZrO_3$-0.04$CaZrO_3$, or
0.94($K_{0.48}Na_{0.52}$)$_{0.96}Li_{0.04}Nb_{0.94}Sb_{0.06}O_3$-
0.01$Bi_{0.5}K_{0.5}ZrO_3$-0.05$CaZrO_3$, or
0.935($K_{0.48}Na_{0.52}$)$_{0.96}Li_{0.04}Nb_{0.94}Sb_{0.06}O_3$-0.01$Bi_{0.51}$
(0.5$ZrO_3$-0.055$CaZrO_3$.

In another embodiment, the lead-free piezoelectric material includes a barium titanate based ternary lead-free piezoelectric ceramic.

In another embodiment, the general formula for the composition of the lead-free piezoelectric material is as follows:
(1-x-y)$BaTiO_3$-x($Ba_{0.5}Ca_{0.5}$)$SnO_{3-y}Ba(Mg_{1/3}Nb_{2/3})O_3$,
wherein in the formula, $0 \le x \le 0.2$, and $0 \le y \le 0.1$.

In another embodiment, the piezoelectric constant $d_{33}$ is in the range of 300 pC/N-1120 pC/N.

In another embodiment, the Curie temperature $T_C$ is in the range of 0° C.-100° C.

In another embodiment, for the general formula (1-x-y)$BaTiO_{3-x}$($Ba_{0.5}Ca_{0.5}$)$SnO_{3-y}Ba(Mg_{1/3}Nb_{2/3})O_3$, when x is 0.11 and y is 0, the composition of the lead-free piezoelectric material is as follows: 0.89$BaTiO_3$-0.11($Ba_{0.5}Ca_{0.5}$)$SnO_3$; as mentioned above, for the barium titanate based ternary lead-free piezoelectric ceramic $0.89BaTiO_3\text{-}0.11(Ba_{0.5}Ca_{0.5})SnO_3$, under the variable temperature conditions, the series of ceramics have the highest piezoelectric constant up to now: $d_{33}=1120$ pC/N. In this case, the ceramics can be used in some occasions having extremely high requirement on the piezoelectric properties, but almost no requirement on the Curie temperature.

According to the contents disclosed in the description, for the general formula $(1\text{-}x\text{-}y)BaTiO_{3\text{-}x}(Ba_{0.5}Ca_{0.5})SnO_{3\text{-}y}Ba(Mg_{1/3}Nb_{2/3})O_3$, as long as x and y satisfy $0 \le x \le 0.2$, and $0 \le y \le 0.1$, the corresponding lead-free piezoelectric materials conforming to the purpose of the present disclosure can be obtained.

In addition, the present disclosure also discloses a preparation process of a lead-free piezoelectric material in another embodiment, which is used to prepare the lead-free piezoelectric material as described above, and the method includes:

Step T001: selecting raw materials according to corresponding chemical general formulae and mixing them; and Step T002: preparing the lead-free piezoelectric material by adopting a traditional solid-state sintering process.

Preferably, the raw materials are selected from: sodium carbonate, potassium carbonate, lithium carbonate, niobium pentoxide, antimony trioxide, bismuth oxide, zirconia, magnesium oxide, tin oxide, calcium carbonate, strontium carbonate and barium carbonate. More preferably, the raw materials are analytically pure.

In addition, in another embodiment, a hard piezoelectric ceramic is disclosed, wherein the hard piezoelectric ceramic is obtained based on the obtaining method described in the present disclosure.

In addition, in another embodiment, a hard piezoelectric ceramic is disclosed, wherein the hard piezoelectric ceramic is obtained based on the lead-free piezoelectric material of the present disclosure.

In addition, in another embodiment, a high-energy converter adopting the hard piezoelectric ceramics of the present disclosure is disclosed.

In addition, in another embodiment, a soft piezoelectric ceramic is disclosed, wherein the soft piezoelectric ceramic is obtained based on the obtaining method described in the present disclosure.

In addition, in another embodiment, a soft piezoelectric ceramic is disclosed, wherein the soft piezoelectric ceramic is obtained based on the lead-free piezoelectric material of the present disclosure.

In addition, in another embodiment, a sensor adopting the soft piezoelectric ceramics of the present disclosure is disclosed; and in another embodiment, an actuator adopting the soft piezoelectric ceramics of the present disclosure is disclosed.

In addition, in another embodiment, an electronic component adopting the hard piezoelectric ceramic and/or adopting the soft piezoelectric ceramic is also disclosed.

In addition, in another embodiment, an electronic device adopting the hard piezoelectric ceramic and/or adopting the soft piezoelectric ceramic is also disclosed.

Each embodiment in the description is described in a progressive manner, focusing on the differences from other embodiments. The same and similar parts of various embodiments can be referred to one another.

The method for obtaining lead-free piezoelectric materials, corresponding lead-free piezoelectric materials, the preparation process, the hard piezoelectric ceramic, the soft piezoelectric ceramic, the high-energy converter, the sensor, the actuator, the electronic component, and the electronic device provided by the present disclosure are introduced in detail. In this disclosure, specific examples are used to explain the principle and implementation mode of the disclosure. The description of the above-mentioned embodiments is only used to help understand the method and core idea of the disclosure; meanwhile, for those skilled in the art, there will be changes in the specific implementation mode and application scope according to the ideas of the disclosure. In summary, the contents of the description should not be interpreted as a restriction on the disclosure.

What is the claimed is:

1. A lead-free piezoelectric material, wherein a general formula for a composition of the lead-free piezoelectric material is represented by:

$(1\text{-}m\text{-}n)[(K_{0.5\text{-}y}Na_{0.5+y})_{0.96}Li_{0.04}Nb_{1\text{-}x}Sb_xO_3]\text{-}m[(Bi_{0.5}(Na_zK_{1\text{-}z})_{0.5}ZrO_3]\text{-}nAZrO_3$, wherein A is selected from one or a combination of the following divalent metal ions: Ca, Mg and Ba; wherein m, n, x, y and A is further defined to meet at least one of the following conditions:

(1) x=0, y=0.02, z=0, m=0.01, and n=0;
   (2) x=0.02, y=0.02, z=0, m=0.01, and n=0;
   (3) x=0.03, y=0.02, z=0, m=0.01, and n=0;
   (4) x=0.04, y=0.02, z=0, m=0.01, and n=0;
   (5) x=0.05, y=0.02, z=0, m=0.01, and n=0;
   (6) x=0.06, y=0.02, z=0, m=0.01, and n=0;
   (7) A=Ca, x=0.06, y=0.02, z=0, m=0.01, and n=0.02;
   (8) A=Ca, x=0.06, y=0.02, z=0, m=0.01, and n=0.03;
   (9) A=Ca, x=0.06, y=0.02, z=0, m=0.01, and n=0.04;
   (10) A=Ca, x=0.06, y=0.02, z=0, m=0.01, and n=0.045;
   (11) A=Ca, x=0.06, y=0.02, z=0, m=0.01, and n=0.05;
   (12) A=Ca, x=0.06, y=0.02, z=0, m=0.01, and n=0.055;
   (13) A=Ca, x=0.06, y=0.02, z=0, m=0.01, and n=0.06;
   (14) A=Ca, x=0.06, y=0.02, z=0, m=0.01, and n=0.065;
   (15) A=Ca, x=0.06, y=0.02, z=0, m=0.01, and n=0.07;
   (16) A=Ca, x=0.06, y=0.02, z=0, m=0.01, and n=0.08; and
   (17) A=Ca, x=0.06, y=0.02, z=0, m=0.01, and n=0.1.

2. The lead-free piezoelectric material according to claim 1, wherein the piezoelectric constant $d_{33}$ is in the range of 190 pC/N-670 pC/N.

3. The lead-free piezoelectric material according to claim 1, wherein the Curie temperature $T_C$ is in the range of 130° C.-410° C.

4. The lead-free piezoelectric material according to claim 1, wherein when the Curie temperature $T_C$ is in the range of 290° C.-410° C., the temperature difference between the C/T phase boundary and the T/O phase boundary is between 270° C. and 350° C., and the $d_{33}$ is in the range of 190 pC/N-330 pC/N.

5. A lead-free piezoelectric material, wherein a general formula for a composition of the lead-free piezoelectric material is represented by:

$(1\text{-}m\text{-}n)[(K_{0.5\text{-}y}Na_{0.5+y})_{0.96}Li_{0.04}Nb_{1\text{-}x}Sb_xO_3]\text{-}m[(Bi_{0.5}(Na_zK_{1\text{-}z})_{0.5}ZrO_3]\text{-}nAZrO_3$, wherein A is selected from one or a combination of the following divalent metal ions: Ca, Mg and Ba, and wherein the composition of the lead-free piezoelectric material is one of the following:

$0.99(K_{0.48}Na_{0.52})_{0.96}Li_{0.04}NbO_3\text{-}0.01Bi_{0.5}K_{0.5}ZrO_3$, or
   $0.99(K_{0.48}Na_{0.52})_{0.96}Li_{0.04}Nb_{0.97}Sb_{0.03}O_3\text{-}0.01Bi_{0.5}K_{0.5}ZrO_3$, or
   $0.99(K_{0.48}Na_{0.52})_{0.96}Li_{0.04}Nb_{0.94}Sb_{0.06}O_3\text{-}0.01Bi_{0.5}K_{0.5}ZrO_3$.

6. The lead-free piezoelectric material according to claim 1, wherein when the $T_C$ is in the range of 200° C.-290° C., the temperature difference between the C/T phase boundary and the T/O phase boundary is between 180° C. and 270° C., and the $d_{33}$ is in the range of 310 pC/N-460pC/N.

7. The lead-free piezoelectric material according to claim 1, wherein the composition of the lead-free piezoelectric material is one of the following:

$0.97(K_{0.48}Na_{0.52})_{0.96}Li_{0.04}Nb_{0.94}Sb_{0.06}O_3$-$0.01Bi_{0.5}K_{0.5}ZrO_3$-$0.02CaZrO_3$, or $0.96(K_{0.48}Na_{0.52})_{0.96}Li_{0.04}Nb_{0.94}Sb_{0.06}O_3$-$0.01Bi_{0.5}K_{0.5}ZrO_3$-$0.03CaZrO_3$.

8. The lead-free piezoelectric material according to claim 1, wherein when the $T_C$ is in the range of 130° C.-200° C., the temperature difference between the C/T phase boundary and the T/O phase boundary is between 110° C. and 180° C., and the $d_{33}$ is in the range of 460 pC/N-670 pC/N.

9. A lead-free piezoelectric material, wherein a general formula for a composition of the lead-free piezoelectric material is represented by:

$(1-m-n)[(K_{0.5-y}Na_{0.5+y})_{0.96}Li_{0.04}Nb_{1-x}Sb_xO_3]$-$m[(Bi_{0.5}(Na_zK_{1-z})_{0.5})ZrO_3]$-$nAZrO_3$, A is selected from one or a combination of the following divalent metal ions: Ca, Mg and Ba, and wherein the composition of the lead-free piezoelectric material is one of the following:

$0.95(K_{0.48}Na_{0.52})_{0.96}Li_{0.04}Nb_{0.94}Sb_{0.06}O_3$-$0.01Bi_{0.5}K_{0.5}ZrO_3$-$0.04CaZrO_3$, or $0.94(K_{0.48}Na_{0.52})_{0.96}Li_{0.04}Nb_{0.94}Sb_{0.06}O_3$-$0.01Bi_{0.5}K_{0.5}ZrO_3$-$0.05CaZrO_3$, or $0.935(K_{0.48}Na_{0.52})_{0.96}Li_{0.04}Nb_{0.94}Sb_{0.06}O_3$-$0.01Bi_{0.5}K_{0.5}ZrO_3$-$0.055CaZrO_3$.

10. A lead-free piezoelectric material, wherein a general formula for a composition of the lead-free piezoelectric material is:

$(1-x-y)BaTiO_{3-x}(Ba_{0.5}Ca_{0.5})SnO_{3-y}Ba(Mg_{1/3}Nb_{2/3})O_3$, wherein in the formula, $0 \le x \le 0.2$, and $0 \le y \le 0.1$.

11. The lead-free piezoelectric material according to claim 10, wherein the piezoelectric constant $d_{33}$ is in the range of 300 pC/N-1120 pC/N.

12. The lead-free piezoelectric material according to claim 10, wherein the Curie temperature $T_C$ is in the range of 0° C.-100° C.

13. The lead-free piezoelectric material according to claim 11, wherein the composition of the lead-free piezoelectric material is:

$0.89BaTiO_3$-$0.11(Ba_{0.5}Ca_{0.5})SnO_3$.

14. A hard piezoelectric ceramic or soft piezoelectric ceramic using the lead-free piezoelectric material according to claim 1.

* * * * *